United States Patent
Hayashi et al.

(10) Patent No.: US 11,294,282 B2
(45) Date of Patent: Apr. 5, 2022

(54) EPOXY-CONTAINING, ISOCYANURATE-MODIFIED SILICONE RESIN, PHOTOSENSITIVE RESIN COMPOSITION, PHOTOSENSITIVE DRY FILM, LAMINATE, AND PATTERN FORMING PROCESS

(71) Applicant: Shin-Etsu Chemical Co., Ltd., Tokyo (JP)

(72) Inventors: Kumiko Hayashi, Annaka (JP); Hitoshi Maruyama, Annaka (JP); Kazunori Kondo, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 179 days.

(21) Appl. No.: 16/114,474

(22) Filed: Aug. 28, 2018

(65) Prior Publication Data
US 2019/0064666 A1    Feb. 28, 2019

(30) Foreign Application Priority Data

Aug. 31, 2017 (JP) .............................. JP2017-166498
Jun. 5, 2018 (JP) .............................. JP2018-107880

(51) Int. Cl.
| | | |
|---|---|---|
| G03F 7/075 | (2006.01) | |
| C08L 61/28 | (2006.01) | |
| G03F 7/039 | (2006.01) | |
| C08L 63/00 | (2006.01) | |
| C08L 83/04 | (2006.01) | |
| C08G 77/52 | (2006.01) | |
| C08G 59/30 | (2006.01) | |
| G03F 7/038 | (2006.01) | |
| C09D 183/14 | (2006.01) | |
| C08K 5/00 | (2006.01) | |
| H01L 21/47 | (2006.01) | |

(52) U.S. Cl.
CPC ......... *G03F 7/0757* (2013.01); *C08G 59/306* (2013.01); *C08G 77/52* (2013.01); *C08L 61/28* (2013.01); *C08L 63/00* (2013.01); *C08L 83/04* (2013.01); *C09D 183/14* (2013.01); *G03F 7/038* (2013.01); *G03F 7/039* (2013.01); *C08K 5/005* (2013.01); *H01L 21/47* (2013.01)

(58) Field of Classification Search
CPC ...... G03F 7/0757; G03F 7/075; G03F 7/0392; C08L 83/08
See application file for complete search history.

(56) References Cited

U.S. PATENT DOCUMENTS

| | | | |
|---|---|---|---|
| 4,990,546 A | 2/1991 | Eckberg | |
| 6,590,010 B2 | 7/2003 | Kato et al. | |
| 7,785,766 B2 | 8/2010 | Kato et al. | |
| 8,715,905 B2 | 5/2014 | Tagami et al. | |
| 2010/0222525 A1* | 9/2010 | Ichiryu | C08G 59/3254 525/476 |
| 2013/0196114 A1* | 8/2013 | Urano | C09D 183/14 428/139 |
| 2015/0158982 A1* | 6/2015 | Saito | C08L 83/04 524/588 |

FOREIGN PATENT DOCUMENTS

| | | |
|---|---|---|
| EP | 1 186 624 A1 | 3/2002 |
| EP | 1 953 183 A2 | 8/2008 |
| EP | 1967540 A1 | 9/2008 |
| EP | 2 397 508 A1 | 12/2011 |
| EP | 2980172 A1 | 2/2016 |
| JP | 8-32763 B2 | 3/1996 |
| JP | 2002-88158 A | 3/2002 |
| JP | 2006-335718 A | 12/2006 |
| JP | 2008-184571 A | 8/2008 |
| JP | 2012-1668 A | 1/2012 |

OTHER PUBLICATIONS

Extended European Search Report dated Dec. 21, 2018, issued in counterpart EP Application No. 18190647.0 (6 pages).
Office Action dated Mar. 9, 2021, issued in counterpart JP Application No. 2018-107880 with Englsh translation. (6 pages).

* cited by examiner

*Primary Examiner* — Daborah Chacko-Davis
(74) *Attorney, Agent, or Firm* — Westerman, Hattori, Daniels & Adrian, LLP

(57) ABSTRACT

A photosensitive resin composition comprising an isocyanurate-modified silicone resin containing an epoxy group in the molecule is easy to form a resin coating which has high transparency, light resistance and heat resistance, is amenable to micro-processing, and is useful in applications for protecting and encapsulating optical devices. The coating can be processed in thick film form to define a pattern having a fine size and perpendicularity, and becomes a cured coating which has improved adhesion to substrates, electronic parts, semiconductor devices, and supports for circuit boards, mechanical properties, electric insulation, and crack resistance, and is reliable as an insulating protective film.

22 Claims, No Drawings

EPOXY-CONTAINING, ISOCYANURATE-MODIFIED SILICONE RESIN, PHOTOSENSITIVE RESIN COMPOSITION, PHOTOSENSITIVE DRY FILM, LAMINATE, AND PATTERN FORMING PROCESS

CROSS-REFERENCE TO RELATED APPLICATION

This non-provisional application claims priority under 35 U.S.C. § 119(a) on Patent Application Nos. 2017-166498 and 2018-107880 filed is Japan on Aug. 31, 2017 and Jun. 5, 2018, respectively, the entire contents of which are hereby incorporated by reference.

TECHNICAL FIELD

This invention relates to an epoxy-containing, isocyanurate-modified silicone resin, a photosensitive resin composition, a photosensitive dry film, a laminate, and a pattern forming process.

BACKGROUND ART

Heretofore, epoxy resins are mainly used as the encapsulating/protecting material for optical devices, typically light-emitting diodes (LEDs) and CMOS image sensors. Among others, epoxy-modified silicone resins are mostly used because of high transparency and light resistance. For example, a silicone resin having an alicyclic epoxy group introduced in the silphenylene structure is known from Patent Document 1. However, these materials are not amenable to micro-processing to a size of the order of 10 μm. Nowadays many optical devices are produced by the micro-processing technology. For the micro-processing purpose, various resist materials as typified by epoxy resin-based materials are used. These materials clear the level of light resistance needed for prior art devices, but fail to clear the level of light resistance needed for advanced optical devices such as LEDs which are currently designed to produce higher outputs. They also suffer from outgassing and discoloration. Patent Document 2 discloses a composition comprising a dual end alicyclic epoxy-modified silphenylene as crosslinker. Those materials targeting higher transparency are not regarded sufficient in heat resistance and light resistance. There is a need for a composition which withstands severer conditions.

In the prior art, photosensitive protective films for semiconductor devices and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 3 discloses a photosensitive silicone composition having improved flexibility. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 4 proposes a photosensitive silicone composition based on a silphenylene structure-containing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in the reliability of such resin compositions is desired.

CITATION LIST

Patent Document 1: JP-B H08-32763

Patent Document 2: JP-A 2012-001668 (U.S. Pat. No. 8,715,905, EP 2397508)

Patent Document 3: JP-A 2002-088158 (U.S. Pat. No. 6,590,010, EP 1186624)

Patent Document 4: JP-A 2008-184571 (U.S. Pat. No. 7,785,766, EP 1953183)

DISCLOSURE OF INVENTION

An object of the invention is to provide an epoxy-containing, isocyanurate-modified silicone resin, a photosensitive resin composition comprising the resin, and a photosensitive dry film using the composition, capable of forming a resin coating which can be processed to form a fine size pattern using radiation having a wide range of wavelength, which has high transparency, light resistance and heat resistance after pattern formation, which can be processed in thick film form to define a fine size pattern, has improved film properties including crack resistance and adhesion to substrates for use in electronic parts and semiconductor devices and supports for use in circuit boards, that is, a cured coating which is reliable as a protective film for electric and electronic parts and a film for bonding substrates. Another object is to provide a laminate and a pattern forming process using the foregoing.

The inventors have found that a photosensitive resin composition comprising an isocyanurate-modified silicone resin containing an epoxy group in the molecule is easy to form a resin coating which has high transparency, light resistance and heat resistance, is amenable to micro-processing, and is useful in applications for protecting and encapsulating optical devices. The coating can be processed in thick film form to define a pattern having a fine size and perpendicularity, and becomes a cured coating or layer which has improved adhesion to substrates, electronic parts, semiconductor devices, and supports for circuit boards, mechanical properties, electric insulation, and crack resistance, and is reliable as an insulating protective film.

In one aspect, the invention provides an epoxy-containing, isocyanurate-modified silicone resin comprising recurring units having the formulae (1) to (6).

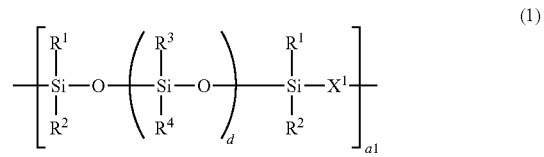

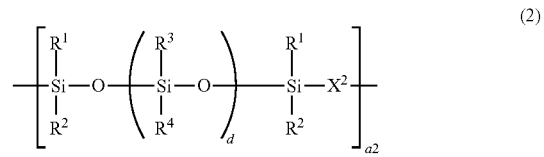

-continued (3)
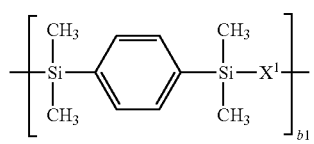

(4)
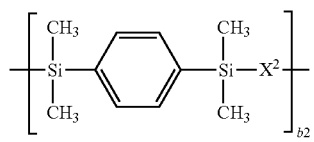

(5)
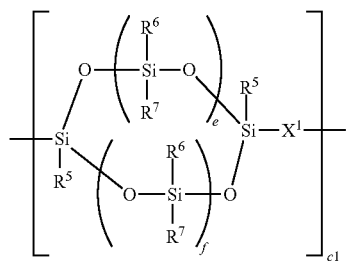

(6)
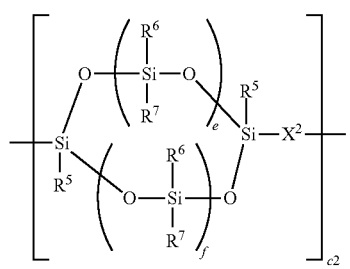

Herein $R^1$ to $R^7$ are each independently hydrogen or a monovalent organic group, at least one of $R^5$ to $R^7$ being an epoxy-containing organic group, a1, a2, b1, b2, c1 and c2 are numbers in the range: $0 \leq a1 < 1$, $0 \leq a2 \leq 1$, $0 \leq b1 < 1$, $0 \leq b2 \leq 1$, $0 \leq c1 < 1$, $0 \leq c2 \leq 1$, $0 < a2+b2+c2 \leq 1$, and $a1+a2+b1+b2+c1+c2=1$, d is an integer of 0 to 300, e and f are integers in the range: $0 \leq e \leq 300$, $0 \leq f \leq 300$, and $0 \leq e+f \leq 300$, $X^1$ is a divalent group having the formula (7):

(7)
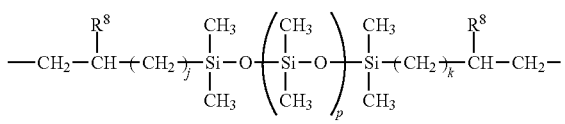

wherein $R^8$ is each independently hydrogen or methyl, j and k are each independently an integer of 0 to 7, p is an integer of 0 to 300, $X^2$ is a divalent group having the formula (8):

(8)
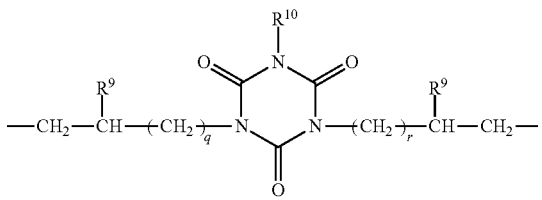

wherein $R^9$ is each independently hydrogen or methyl, $R^{10}$ is a $C_1$-$C_8$ alkyl allyl, glycidyl or $C_6$-$C_{10}$ aryl group, q and r are each independently an integer of 0 to 7.

In a preferred embodiment, $R^1$ to $R^7$ are each independently hydrogen, a $C_1$-$C_8$ monovalent hydrocarbon group, or an epoxy-containing organic group having the formula (9) or (10), at least one of $R^5$ to $R^7$ being an epoxy-containing organic group having the formula (9) or (10).

(9)
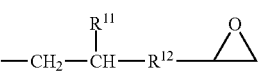

(10)
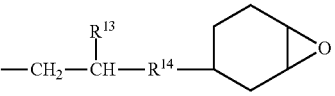

wherein $R^{11}$ and $R^{13}$ are each independently hydrogen or methyl, $R^{12}$ and $R^{14}$ are each independently a single bond or $C_1$-$C_8$ alkylene group in which any methylene moiety may be substituted by an ether bond, sulfide bond or phenylene moiety.

In a second aspect, the invention provides a photosensitive resin composition comprising (A) the epoxy-containing, isocyanurate-modified silicone resin defined above and (B) a photoacid generator which is decomposed to generate an acid upon light exposure.

In a preferred embodiment, the photosensitive resin composition further comprises (C) a crosslinker containing an epoxy-containing compound.

Typically, the epoxy-containing compound is a compound having on the average at least two epoxy groups in the molecule.

The photosensitive resin composition may further comprise (D) a solvent, (E) an antioxidant, and/or (F) a quencher.

In a third aspect, the invention provides a photosensitive resin coating comprising (A) the epoxy-containing, isocyanurate-modified silicone resin defined above and (B) a photoacid generator which is decomposed to generate an acid upon light exposure.

In another embodiment, the invention provides a photosensitive resin coating formed of the photosensitive resin composition defined above.

In a fourth aspect, the invention provides a photosensitive dry film comprising a support film and the photosensitive resin coating thereon.

In a fifth aspect, the invention provides a laminate comprising a substrate having grooves and/or holes having an opening width of 10 to 100 μm and a depth of 10 to 120 μm and the photosensitive resin coating thereon.

In a sixth aspect, the invention provides a pattern forming process comprising the steps of:

(i) coating the photosensitive resin composition onto a substrate to form a photosensitive resin coating thereon, (ii) exposing the photosensitive resin coating to radiation through a photomask, and (iii) developing the exposed resin coating in a developer.

In a seventh aspect, the invention provides a pattern forming process comprising the steps of:

(i') attaching the photosensitive dry-film at its photosensitive resin coating to a substrate to dispose the photosensitive resin coating thereon, (ii) exposing the photosensitive resin coating to radiation through a photomask, and (iii) developing the exposed resin coating in a developer.

The pattern forming process may further comprise the step of baking the resin coating after exposure and before development and the step of post-curing the resin coating at a temperature of 120 to 300° C. after development.

In a preferred embodiment, the substrate has grooves and/or holes having an opening width of 10 to 100 μm and a depth of 10 to 120 μm.

In an eighth aspect, the invention provides a method for producing an opto-semiconductor device, comprising the pattern forming process defined above, the opto-semiconductor device having a pattern of the photosensitive resin coating; or a method for producing an optical device, comprising the pattern forming process defined above, the optical device having a pattern of the photosensitive resin coating.

Advantageous Effects of Invention

The photosensitive resin composition comprising an epoxy-containing, isocyanurate-modified silicone resin can be readily applied to form a coating without oxygen damages, be sensitive to radiation having a wide range of wavelength, and be processed to form a fine size pattern. The resin coating obtained from the composition has transparency, light resistance and heat resistance and is useful in applications for protecting and encapsulating optical devices or the like.

The photosensitive resin composition and the photosensitive dry film of the invention have many advantages of photosensitive material and can be readily processed in thick film form to define a fine size pattern. The cured coating is fully resistant to chemicals such as photoresist strippers, has improved film properties including adhesion to substrates, electronic parts, semiconductor devices, and supports for circuit boards, mechanical properties, and electric insulation, and is thus fully reliable as an insulating protective film. The cured coating also has crack resistance and is thus useful as a protective film-forming material for electric and electronic parts (such as circuit boards, semiconductor devices and display units) and a film-forming material for bonding substrates. The laminate obtained using the photosensitive resin composition or the photosensitive dry film has tight adhesion between the cured coating and the substrate and improved flatness.

DESCRIPTION OF PREFERRED EMBODIMENT

As used herein, the notation (Cn-Cm) means a group containing from n to m carbon atoms per group.

Epoxy-Containing, Isocyanurate-Modified Silicone Resin

One embodiment of the invention is an epoxy-containing, isocyanurate-modified silicone resin (sometimes referred to as modified silicone resin, hereinafter) comprising recurring units having the formulae (1) to (6).

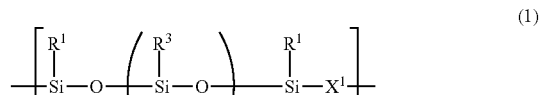

(1)

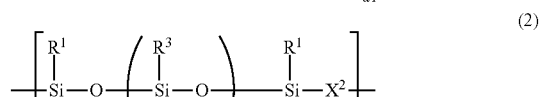

(2)

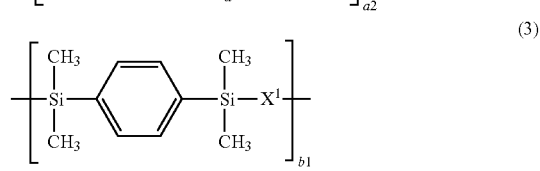

(3)

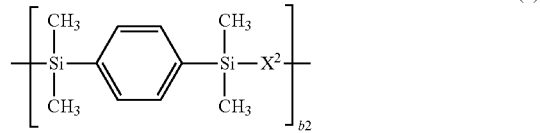

(4)

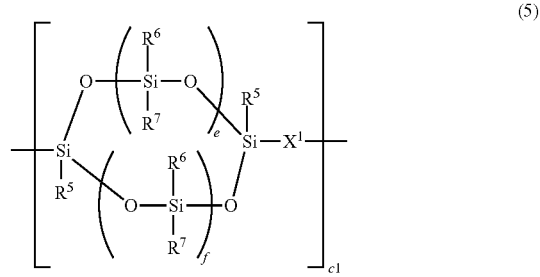

(5)

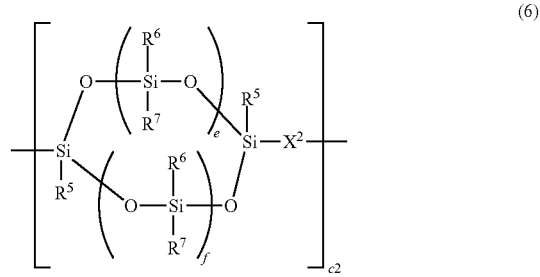

(6)

In formulae (1), (3) and (5), $X^1$ is a divalent group having the formula (7):

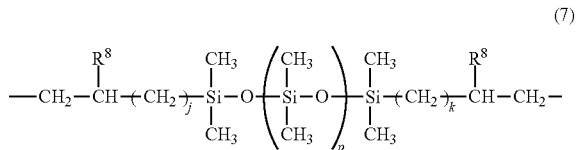

(7)

wherein $R^8$ is each independently hydrogen or methyl, j and k are each independently an integer of 0 to 7, and p is an integer of 0 to 300.

In formulae (2), (4) and (6), $X^2$ is a divalent group having the formula (8):

(8)

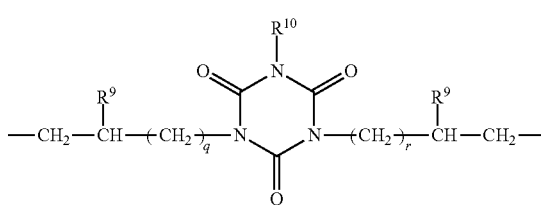

wherein $R^9$ is each independently hydrogen or methyl, $R^{10}$ is a $C_1$-$C_8$ alkyl group, allyl group, glycidyl group or $C_6$-$C_{10}$ aryl group, q and r are each independently an integer of 0 to 7.

Suitable $C_1$-$C_8$ alkyl groups include straight, branched or cyclic alkyl groups such as methyl, ethyl, propyl, butyl, pentyl hexyl, cyclopentyl and cyclohexyl. Suitable $C_6$-$C_{10}$ aryl groups include phenyl and naphthyl.

In formulae (1), (2), (5) and (6), $R^1$ to $R^7$ are each independently hydrogen or a monovalent organic group, at least one of $R^5$ to $R^7$ being an epoxy-containing organic group. The preferred monovalent organic groups include $C_1$-$C_8$ monovalent hydrocarbon groups, and epoxy-containing organic groups having the formula (9) or (10).

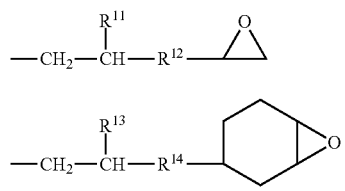

Herein $R^{11}$ and $R^{13}$ are each independently hydrogen or methyl. $R^{12}$ and $R^{14}$ are each independently a single bond or a $C_1$-$C_8$ alkylene group in which any methylene moiety may be substituted by an ether bond, sulfide bond or phenylene moiety.

Suitable $C_1$-$C_8$ monovalent hydrocarbon groups include straight, branched or cyclic alkyl groups such as methyl, ethyl, propyl, butyl, pentyl, hexyl, cyclopentyl, and cyclohexyl, aryl groups such phenyl, and aralkyl groups such as benzyl and phenethyl. Inter alia, methyl, ethyl and phenyl are preferred for availability of reactants.

Suitable $C_1$-$C_8$ alkylene groups are straight, branched or cyclic alkylene groups including methylene, ethylene, propylene, tetramethylene, butylene, and cyclohexylene.

Preferably $R^1$ to $R^7$ are each independently hydrogen, a $C_1$-$C_8$ monovalent hydrocarbon group, or an epoxy-containing organic group having formula (9) or (10), at least one of $R^5$ to $R^7$ being an epoxy-containing organic group having formula (9) or (10). More preferably, at least 20 mol % of all groups $R^1$ to $R^7$ are epoxy-containing organic groups. If none of epoxy-containing functional groups are included in formula (1), no crosslinking takes place between components (A) and (B).

Preferably the modified silicone resin is capped at one end or both ends with an epoxy-containing organic group having formula (9) or (10).

In formulae (1) to (6), a1, a2, b1, b2, c1 and c2 each are a number in the range: $0 \leq a1 < 1$, $0 \leq a2 \leq 1$, $0 \leq b1 < 1$, $0 \leq b2 \leq 1$, $0 \leq c1 < 1$, $0 \leq c2 \leq 1$, $0 < a2+b2+c2 \leq 1$, and $a1+a2+b1+b2+c1+c2=1$; preferably $0 \leq a1 \leq 0.8$, $0 \leq a2 \leq 0.9$, $0 \leq b1 \leq 0.8$, $0 \leq b2 \leq 0.9$, $0 \leq c1 \leq 0.8$, $0 \leq c2 \leq 0.9$, $0.1 \leq a2+b2 \leq 0.9$, $0.2 \leq a2+b2+c2 \leq 1$, and $a1+a2+b1+b2+c1+c2=1$; more preferably $0 \leq a1 \leq 0.6$, $0 \leq a2 \leq 0.8$, $0 \leq b1 \leq 0.6$, $0 \leq b2 \leq 0.8$, $0 \leq c1 \leq 0.6$, $0.2 \leq c2 \leq 0.8$, $0.2 \leq a2+b2 \leq 0.8$, $0.4 \leq a2+b2+c2 \leq 1$, and $a1+a2+b1+b2+c1+c2=1$.

In formulae (1) and (2), d is an integer of 0 to 300, preferably 0 to 200, more preferably 0 to 100.

In formulae (5) and (6), e and f each are an integer in the range: $0 \leq e \leq 300$, $0 \leq f \leq 300$, $0 \leq e+f \leq 300$; preferably $0 \leq e \leq 100$, $0 \leq f \leq 100$, $0 \leq e+f \leq 100$; more preferably $0 \leq e \leq 10$, $0 \leq f \leq 10$, $0 \leq e+f \leq 10$.

As the recurring unit having formula (1), a unit of the following formula is preferred.

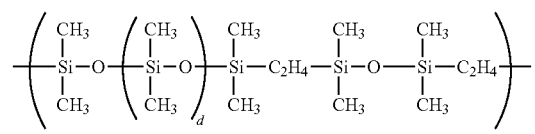

Herein d is as defined above.

As the recurring unit having formula (2), units of the following formulae are preferred.

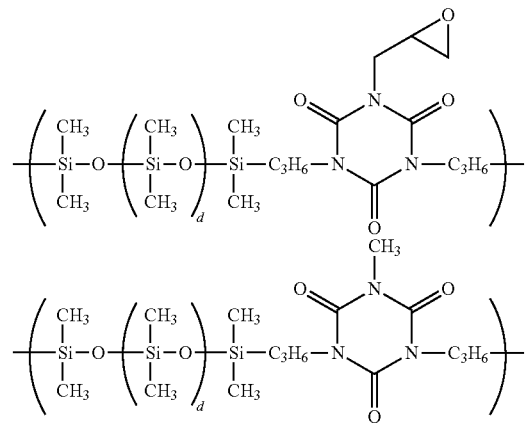

Herein d is as defined above.

As the recurring unit having formula (3), a unit of the following formula is preferred.

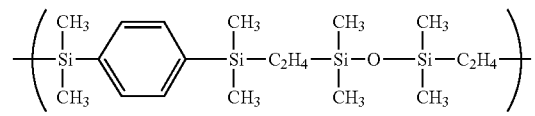

As the recurring unit having formula (4), units of the following formulae are preferred.

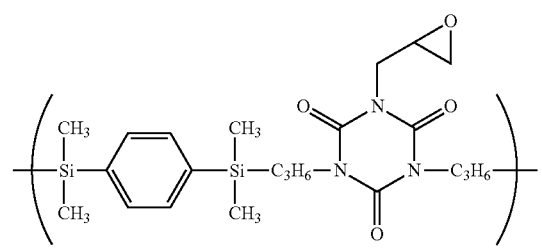

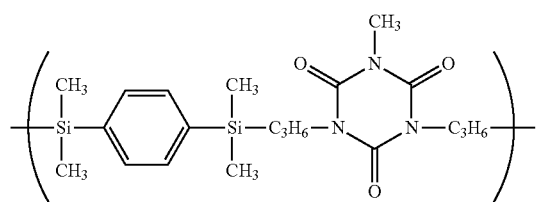
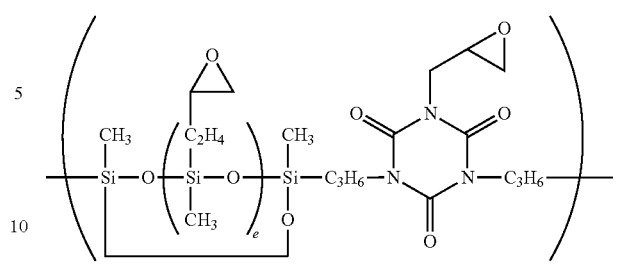
As the recurring unit having formula (5), units of the following formulae are preferred.
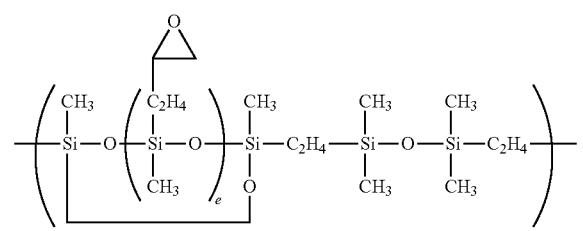
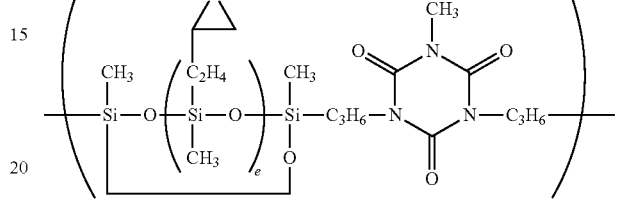
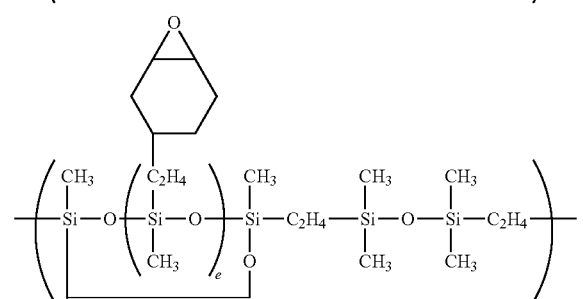
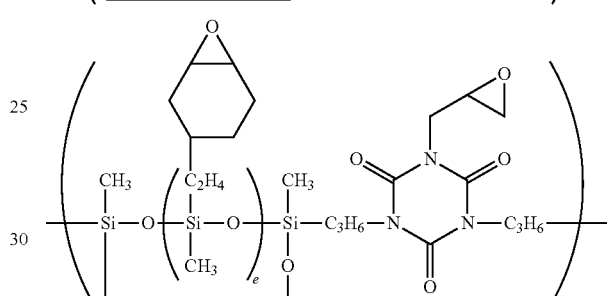
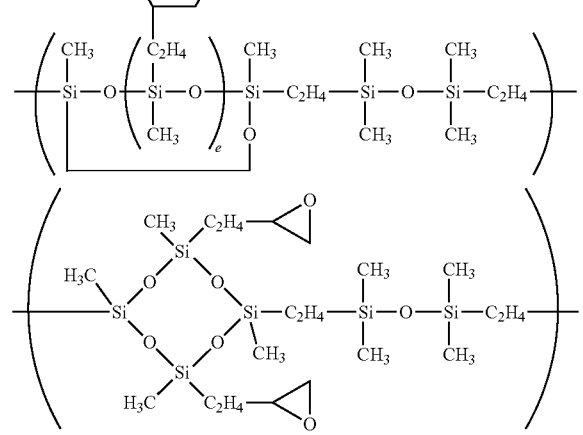
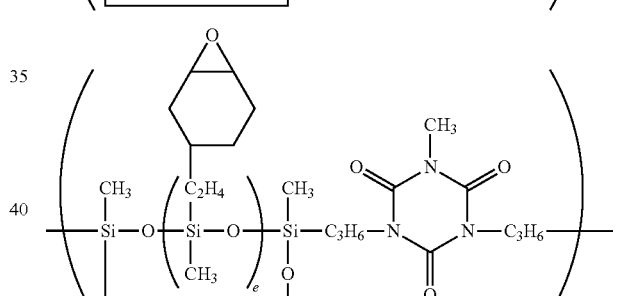
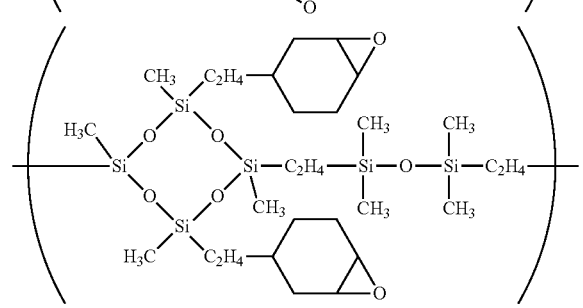
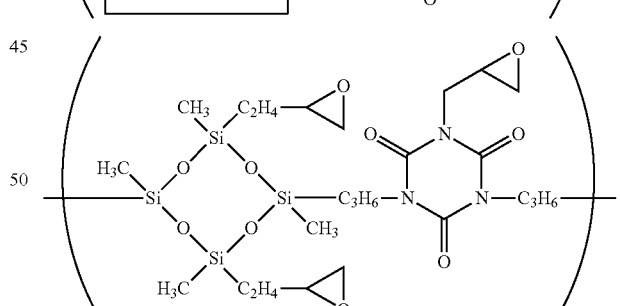
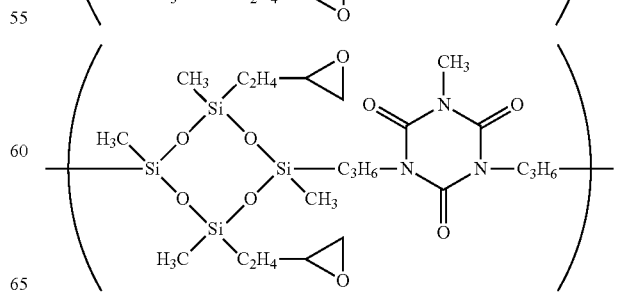
Herein e is as defined above.
As the recurring unit having formula (6), units of the following formulae are preferred.

-continued

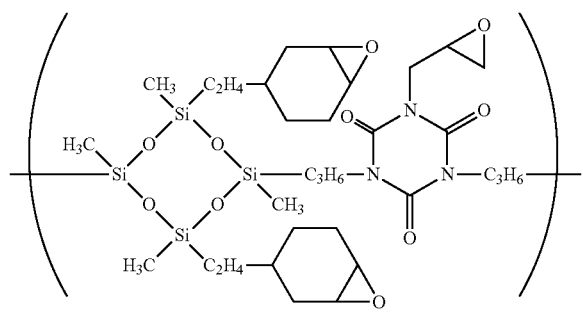

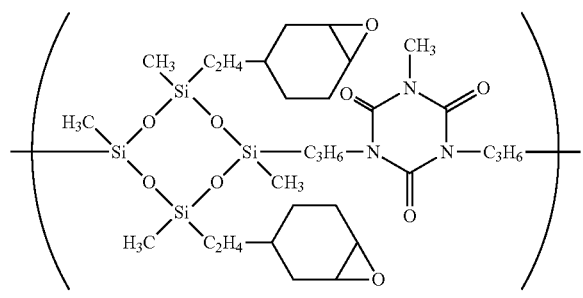

Herein e is as defined above.

In the modified silicone resin, individual recurring units as defined above may be arranged either randomly or blockwise. The content of silicone (i.e., siloxane units) is preferably 30 to 80% by weight.

The modified silicone resin contains an isocyanurate group in the molecule. Since the isocyanurate group is excellent in heat resistance and transparency, the modified silicone resin containing the same is also excellent in heat resistance and transparency.

The modified silicone resin preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran (THF) as the elute.

Method for Preparing Modified Silicone Resin

The epoxy-containing, isocyanurate-modified silicone resin of the invention may be prepared by addition polymerization of at least one compound selected from compounds having the formulae (11) to (13), a compound having the formula (14), and optionally a compound having she formula (15), all shown below, in the presence of a metal catalyst.

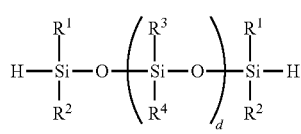

(11)

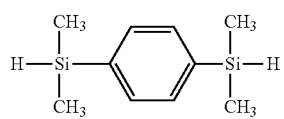

(12)

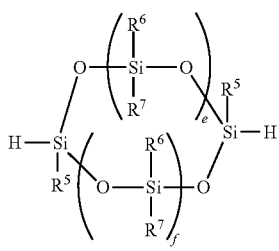

(13)

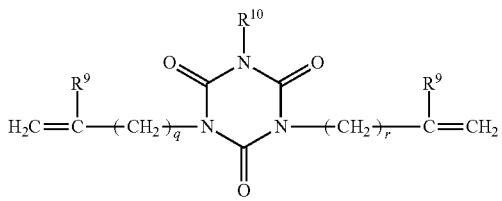

(14)

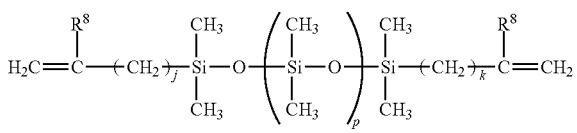

(15)

Herein $R^1$ to $R^{10}$, d, e, f, j, k, p, q and r are as defined above.

Examples of the metal catalyst used include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972, chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotis(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight of platinum group metal based on the total weight of the compounds (exclusive of the solvent) used in the addition polymerization.

In the addition polymerization, a solvent may be used, if desired. Suitable solvents are hydrocarbon solvents such as toluene and xylene. The reaction temperature is preferably in a range of 40 to 150° C., more preferably 60 to 120° C., within which the catalyst is not deactivated and the polymerization can be completed within a short time. The polymerization time varies with the type and amount of the resulting resin. It is preferably about 0.5 to about 100 hours, more preferably about 0.5 to about 30 hours for preventing moisture entry into the polymerization system. After the completion of reaction, the solvent (if used) is distilled off, whereupon the modified silicone resin is obtained.

The reaction procedure is not particularly limited. For example, when a compound having formula (11), a compound having formula (12), a compound having formula (13), a compound having formula (14), and a compound having formula (15) are reacted, the preferred procedure is by first mixing the compounds having formulae (11), (12) and (13), heating, adding a metal catalyst to the mixture, and then adding the compounds having formulae (14) and (15) dropwise over 0.1 to 5 hours.

In the addition polymerization, the reactants are preferably combined in such amounts that a molar ratio of the total amount of hydrosilyl groups in the compounds having formulae (11), (12) and (13) to the total amount of alkenyl groups in the compounds having formulae (14) and (15) may range from 0.67 to 1.67, more preferably from 0.83 to 1.25.

More particularly, the compounds having formulae (14) and (15) are preferably combined in such amounts that a molar ratio of (14):(15) may range from 100:0 to 50:50, more preferably from 100:0 to 70:30.

Also, the compounds having formulae (11), (12) and (13) are preferably combined in such amounts that a molar ratio of (11):(12):(13) may range from 90:5:5 to 50:25:25, more preferably from 90:5:5 to 60:20:20.

During polymerization of the foregoing compounds, a compound having epoxy and alkenyl groups may be co-reacted in order to block the modified silicone resin at its end with an epoxy-containing organic group. When the compounds having formulae (11) to (13) wherein at least one of $R^1$ to $R^7$ is hydrogen are polymerized, an epoxy group may be introduced into the silicone resin by co-reaction of a compound having epoxy and alkenyl groups.

The compounds having epoxy and alkenyl groups are preferably compounds having the formulae (16) and (17).

(16)

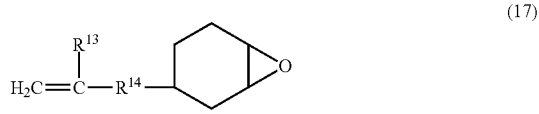

(17)

Herein $R^{11}$ to $R^{14}$ are as defined above.

The compound having epoxy and alkenyl groups may be used in an amount of 0.1 to 2.5 moles, more preferably 0.5 to 2.5 moles, even more preferably 1 to 2 moles per mole of the total hydrosilyl groups on the compounds having formulae (11), (12) and (13).

The Mw of the modified silicone resin can be controlled using a molecular weight control agent such as a monoallyl compound (e.g., o-allylphenol), monohydrosilane (e.g., triethylhydrosilane) or monohydrosiloxane.

Photosensitive Resin Composition

Another embodiment of the invention is a photosensitive resin composition comprising (A) the epoxy-containing, isocyanurate-modified silicone resin defined above and (B) a photoacid generator which is decomposed to generate an acid upon exposure to light. From the photosensitive resin composition, a film having a thickness varying over a wide range can be formed, from which a pattern having a fine size and perpendicularity can be formed by a pattern forming process to be described later. A cured film obtained from the photosensitive resin composition is improved in transparency, light resistance, heat resistance, micro-processing amenability, and pattern formation. Component (A) may be a single modified silicone resin or a combination of two or more modified silicone resins.

(B) Photoacid generator

The photoacid generator (PAG) as component (B) is not particularly limited as long as it is decomposed to generate an acid upon exposure to light, preferably light of wavelength 240 to 500 nm, the generated acid serving as a curing catalyst. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Suitable onium salts include sulfonium salts having the following formula (18) and iodonium salts having the following formula (19).

(18)

(19)

In formulae (18) and (19), $R^{101}$ is each independently a $C_1$-$C_{12}$ alkyl group, $C_6$-$C_{12}$ aryl group, or $C_7$-$C_{12}$ aralkyl group, which may have a substituent. $A^-$ is a non-nucleophilic counter ion.

Examples of the alkyl group which may be straight, branched or cyclic include methyl, ethyl, propyl, butyl, cyclohexyl, norbornyl, and adamantyl. Exemplary aryl groups include phenyl, naphthyl and biphenylyl. Exemplary aralkyl groups include benzyl and phenethyl. Examples of the substituent include oxo, straight, branched or cyclic $C_1$-$C_{12}$ alkoxy groups, straight, branched or cyclic $C_1$-$C_{12}$ alkyl groups. $C_6$-$C_{24}$ aryl groups. $C_7$-$C_{25}$ aralkyl groups, $C_6$-$C_{24}$ aryloxy groups, and $C_6$-$C_{24}$ arylthio groups.

Preferably $R^{101}$ is selected from optionally substituted alkyl groups such as methyl, ethyl, propyl, butyl, cyclohexyl, norbornyl, adamantyl, 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Inter alia, optionally substituted aryl groups and optionally substituted aralkyl groups are more preferred.

Examples of the non-nucleophilic counter ion represented by $A^-$ include halide ions such as chloride and bromide; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Exemplary diazomethane derivatives are compounds of the following formula (20).

(20)

In formula (20), $R^{102}$ is each independently a straight, branched or cyclic $C_1$-$C_{12}$ alkyl or haloalkyl group, optionally substituted $C_6$-$C_{12}$ aryl group, or $C_7$-$C_{12}$ aralkyl group.

Examples of the alkyl group include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl, and adamantyl. Exemplary haloalkyl groups include trifluoromethyl, 1,1,1-trifluoroethyl, 1,1,1-trichloroethyl, and nonafluorobutyl.

Examples of the optionally substituted aryl groups include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Exemplary aralkyl groups include benzyl and phenethyl.

Exemplary glyoxime derivatives are compounds of the following formula (21).

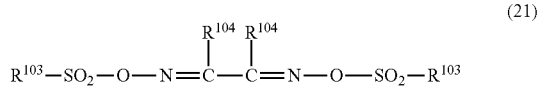

(21)

In formula (21), $R^{103}$ and $R^{104}$ are each independently a $C_1$-$C_{12}$ alkyl or halo-alkyl group, an optionally substituted $C_6$-$C_{12}$ aryl group, or a $C_7$-$C_{12}$ aralkyl group, $R^{104}$ may bond together to form a ring with the carbon atom to which, they are attached. Each $R^{104}$ is a $C_1$-$C_6$ straight or branched alkylene group when they form a ring.

Examples of the alkyl, halo-alkyl, optionally substituted aryl, and aralkyl groups are as exemplified above for $R^{102}$. Suitable straight or branched alkylene groups include methylene, ethylene, propylene, butylene and hexylene.

Exemplary onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-tolenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl (2-oxocyclohexyl)sulfonium trifluoromethanesulfonate, cyclohexylmethyl(2-oxocyclohexyl)sulfonium p-toluenesulfonate. dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl (4-thiophenoxyphenyl)sulfonium hexafluoroantimonate, [4-(4-biphenylylthio)phenyl]-4-biphenylylphenylsulfonium tris(trifluoromethanesulfonyl)-methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis(pentafluorophenyl)borate.

Exemplary diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsufonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Exemplary glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Exemplary β-ketosulfone derivatives include 2-cyclohexylcarbonyl-2-(p-toluenesolfonyl)propane and 2-isopropylcarbonyl-2-(p-toluenesulfonyl)propane.

Exemplary disulfone derivatives include diphenyl disulfone and dicyclohexyl disulfone.

Exemplary nitrobenzyl sulfonate derivatives include 2,6-dinitrobenzyl p-toluenesulfonate and 2,4-dinitrobenzyl p-toluenesulfonate.

Exemplary sulfonic acid ester derivatives include 1,2,3~tris(methanesulfonyloxy)benzene, 1,2,3-tris(trifluoromethanesulfonyloxy)benzene, and 1,2,3-tris(p-toluenesulfonyloxy)benzene.

Exemplary imido-yl sulfonate derivatives include phthalimidoyl triflate, phthalimidoyl tosylate, 5-norbomene-2,3-dicarboxyimidoyl triflate, 5-norbomene-2,3-dicarboxyimidoyl tosylate, 5-norbomene-2,3-dicarboxyimidoyl n-butylsulfonate, and N-trifluoromethylsulfonyloxynaphthylimide.

Typical of the oxime sulfonate derivative is α-(benzenesulfoniumoxyimino)-4-methylphenylacetonitrile.

Also included are iminosulfonate derivatives such as (5-(4-methylphenyl)sulfonyloxyimino-5H-thiopen-2-ylidene)-(2-methylphenyl)acetonitrile and (5-(4-(4-methylphenylsulfonyloxy)phenylsulfonyloxyimino)-5H-thiopen-2-ylidene)-(2-methylphenyl)acetonitrile, as well as 2-methyl-2[(4-methylphenyl)sulfonyl]-1-[(4-methylthio) phenyl]-1-propane.

As the PAG, the above-exemplified onium salts are preferred, and the above-exemplified sulfonium salts are more preferred.

From the standpoint of photo-cure, the PAG (B) is preferably used in an amount of 0.05 to 20 parts by weight, and more preferably 0.05 to 5 parts by weight per 100 parts by weight of component (A). When the amount of the PAG is at least 0.05 part, it may generate a sufficient amount of acid for crosslinking reaction to proceed. As long as the amount of the PAG is up to 20 parts, any increase of the light absorption by the PAG itself is prevented and a lowering of transparency is avoided. The PAGs may be used alone or in admixture of two or more.

(C) Crosslinker

The photosensitive resin composition may further comprise (C) a crosslinker. Although the crosslinker is optional, it is effective for facilitating pattern formation and increasing the strength of a coating of the resin composition.

The crosslinker should contain at least one epoxy-containing compound. The epoxy-containing compound is preferably a compound having on the average at least two epoxy groups in the molecule.

Examples of the epoxy compound having on the average at least two epoxy groups in the molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

As the crosslinker (C), organosilicon compounds having on the average at least two epoxy groups in the molecule are also useful. Typical of such epoxy-containing organosilicon compounds are dual end alicyclic epoxy-modified silphenylenes (see Patent Document 2).

The crosslinker (C) may be used in an amount of 0 to 100 parts, preferably 0.5 to 50 parts, more preferably 1 to 30 parts by weight per 100 parts by weight of component (A). At least 0.5 part of component (C) ensures sufficient cure upon light exposure. As long as the amount of component (C) is up to 100 parts, a proportion of the modified silicone resin in the composition is not reduced, allowing the cured composition to exert its effects to the full extent. Component (C) may be used alone or in admixture.

(D) Solvent

The photosensitive resin composition may further comprise a solvent as component (D) for facilitating coating properties. The solvent used herein is not particularly limited as long as components (A) to (C), and component (E) and additives to be described later are soluble.

Organic solvents are preferred. Examples of the organic solvent include ketones such as cyclohexanone, cyclopentanone and methyl-2-n-pentylkefone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in admixture.

Of these solvents, preferred are ethyl lactate, cyclohexanone, cyclopentanone, PGMEA, γ-butyrolactone, and mixtures thereof, in which the PAG is most soluble.

From the standpoints of compatibility and viscosity of the resin composition, the amount of solvent (D) used is preferably 50 to 2,000 parts, more preferably 50 to 1,000 parts, and even more preferably 50 to 100 parts by weight per 100 parts by weight of components (A) and (B) combined.

(E) Antioxidant

The photosensitive resin composition may further comprise an antioxidant as component (E). The antioxidant is effective for improving heat resistance and allows the composition to be transparent.

The antioxidant is preferably selected from hindered phenol compounds, primary aliphatic amine compounds, and hindered amine compounds.

Although the hindered phenol compounds used herein are not particularly limited, the hindered phenol compounds listed below are preferred 1,3,5-trimethyl-2,4,6-tris(3,5-di-t-butyl-4-hydroxybenzyl)benzene (trade name: IRGANOX 1330), 2,6-di-t-butyl-4-methylphenol (trade name: Sumilizer BHT), 2,5-di-t-butylhydroquinone (trade name: Nocrac NS-7), 2,6-di-t-butyl-4-ethylphenol (trade name: Nocrac M-17), 2,5-di-t-pentyl-hydroquinone (trade name: Nocrac DAH), 2,2'-methylenebis(4-methyl-6-t-butylphenol) (trade name: Nocrac NS-6), 3,5-di-t-butyl-4-hydroxybenzyl phosphonate diethyl ester (trade name: IRGANOX 1222), 4,4'-thiobis(3-methyl-6-t-butylphenol) (trade name: Nocrac 300), 2,2'-methylenebis(4-ethyl-6-t-butylphenol) (trade name: Nocrac NS-5), 4,4'-butylidenebis(3-methyl-6-t-butylphenol) (Adeka Stab AO-40), 2-t-butyl-6-(3-t-butyl-2-hydroxy-5-methylbenzyl)-4-methylphenyl acrylate (trade name: Sumilizer GM), 2-[1-(2-hydroxy-3,5-di-t-pentylphenyl)ethyl]-4,6-di-t-pentylphenyl acrylate (trade name: Sumilizer GS), 2,2'-methylenebis[4-methyl-6-(α-methylcyclohexyl)phenol], 4,4'-methylenebis(2,6-di-t-butylphenol) (trade name: Seenox 226M), 4,6-bis(octylthiomethyl)-o-cresol (trade name: IRGANOX 1520L), 2,2'-ethylenebis(4,6-di-t-butylphenol), octadecyl 3-(3,5-di-t-butyl-4-hydroxyphenyl)propionate (trade name: IRGANOX 1076), 1,1,3-tris(2-methyl-4-hydroxy-5-t-butylphenyl)butane (trade name: Adeka Stab AO-30), tetrakis[methylene-(3,5-di-t-butyl-4-hydroxyhydrocinnamate)]methane (trade name: Adeka Stab AO-60), triethylene glycol bis[3-(3-t-butyl-5-methyl-4-hydroxy-phenyl)propionate] (trade name: IRGANOX 245), 2,4-bis(n-octylthio)-6-(4-hydroxy-3,5-di-t-butylanilino)-1,3,5-triazine (trade name: IRGANOX 565), N,N'-hexamethylenebis-(3,5-di-t-butyl-4-hydroxyhydrocinnamide) (tradename: IRGANOX 1098), 1,6-hexanediol-bis[3-(3,5-di-t-butyl-4-hydroxyphenyl)propionate] (trade name: IRGANOX 259), 2,2-thio-diethylenebis[3-(3,5-di-t-butyl-4-hydroxyphenyl)propionate] (trade name: IRGANOX 1035), 3,9-bis[2-[3-(3-t-butyl-4-hydroxy-5-methylphenyl)propionyloxy]-1,1-dimethylethyl] 2,4,8,10-tetraoxaspiro[5.5]undecane (trade name: Sumilizer GA-80), tris(3,5-di-t-butyl-4-hydroxybenzyl) isocyanurate (trade name: IRGANOX 3114), bis(ethyl 3,5-di-t-butyl-4-hydroxybenzylphosphonate) calcium/polyethylene wax 50/50 mixture (trade name: IRGANOX 1425WL), isooctyl 3-(3,5-di-t-butyl-4-hydroxyphenyl)propionate (trade name: IRGANOX 1135), 4,4'-thiobis(6-t-butyl-3-methylphenol) (trade name: Sumilizer WX-R), 6-[3-(3-t-butyl-4-hydroxy-5-methylphenyl)propoxy]2,4,8,10-tetra-t-butyldibenzo[d,f][1,3,2]dioxaphosphepin (trade name: Sumilizer GP), etc.

Examples of the primary aliphatic amine include ammonia, methylamine, ethylamine, n-propylamine, isopropylamine, n-butylamine, isobutylamine, sec-butylamine, tertbutylamine, pentylamine, tert-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Although the hindered amine compounds used herein are not particularly limited, the hindered amine compounds listed below are preferred. p,p'-dioctyldiphenylamine (trade name: IRGANOX 5057), phenyl-α-naphthylamine (trade name: Nocrac PA), poly(2,2,4-trimethyl-1,2-dihydroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphthyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'-(α,α-dimethylbenzyl)diphenylamine (trade name: Nocrac CD), p,p-toluenesulfonyl-aminodiphenylamine (trade name: Nocrac TD), N-phenyl-N'-(3-methacryloxy-2-hydroxy-propyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), dimethyl-1-(2-hydroxyyl)-4-hydroxy-2,2,6,6-tetramethylpiperidine succinate polycondensate (trade name: Tinuvin 622LD), poly[[6-(1,1,3,3-tetramethylbutyl)amino]-1,3,5-triazine-2,4-diyl][(2,2,6,6-tetramethyl-4-piperidyl)imino]hexamethylene[(2,2,6,6-tetramethyl-4-piperidyl)imino]] (trade name: CHIMASSORB 944), N,N'-bis(3-aminopropyl)ethylene-diamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: Tinuvin 123), bis(2,2,6,6-tetramethyl-4-piperidyl)sebacate (trade name: Tinuvin 770), bis(1,2,2,6,6-pentamethyl-4-piperidyl) 2-(3,5-di-t-butyl-4-hydroxybenzyl)-2-n-butylmalonate (trade name: Tinuvin 144), bis(1,2,2,6,6-pentamethyl-4-piperidyl) sebacate (tradename: Tinuvin 765), tetrakis(1,2,2,6,6-pentamethyl-4-piperidyl) 1,2,3,4-butanetetracarboxylate (trade name: LA-57), tetrakis(2,2,6,6-tetramethyl-4-piperidyl) 1,2,3,4-butanetetracarboxylate (trade name LA-52), an esterified mixture of 1,2,3,4-butanetetracarboxylic acid with 1,2,2,6,6-pentamethyl-4-piperidinol and 1-tridecanol (trade name LA-62), an esterified mixture of 1,2,3,4-butanetetracarboxylic acid with 2,2,6,6-tetramethyl-4-piperidinol and 1-tridecanol (trade name LA-67), an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD), (2,2,6,6-tetramethylene-4-piperidyl)-2-propylene carboxylate (trade name: Adeka Stab LA-82), (1,2,2,6,6-pentamethyl-4-piperidyl)-2-propylene carboxylate (trade name: Adeka Stab LA-87), etc.

The amount of component (E) is not particularly limited as long as the benefits of the invention are not impaired. When used, the amount of component (E) is preferably 0.01 to 1% by weight of the resin composition.

(F) Quencher

The photosensitive resin composition may further contain a quencher as component (F). The quencher used herein is preferably a compound capable of suppressing the rate of diffusion when the acid generated by the PAG diffuses within the resin coating. The inclusion of the quencher improves resolution, suppresses changes in sensitivity following exposure and reduces substrate and environment dependence, as well as improving the exposure latitude and the pattern profile.

Typical of the quencher are basic compounds including secondary or tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodedylamine, dicetylamine, N,N-dimethylmethylenediamine, N,N-dimethylethylenediamine, and N,N-dimethyltetraethylenepentamine.

Suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Suitable mixed amines include dimethylethylamine, methylethylpropylamine, benzylamine, phenethylamine, and benzyldimethylamine.

Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyridine derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Suitable nitrogen-containing compounds with sulfonyl group include 3-pyridinesulfonic acid and pyridinium p-toluenesulfonate.

Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Suitable amide derivatives include formamide, N-methylformamide, N,N-dimethylfomamide, acetamide, N-methylacetamide, N,N-dimethylacetamide, propionamide, and benzamide.

Suitable imide derivatives include phthalimide, succinimide, and maleimide.

Basic compounds having the formula (22) are also useful quenchers.

(22)

In formula (22), z is 1, 2 or 3. $R^{105}$ is independently selected from substituent groups of the following formulae (23) to (25). $R^{106}$ is independently hydrogen or a straight, branched or cyclic $C_1$-$C_{20}$ alkyl group which may contain an ether bond or hydroxyl moiety. When at least two groups $R^{105}$ are included, two groups $R^{105}$ may bond together to form a ring with the nitrogen atom to which they are attached. Also when at least two groups $R^{105}$ are included, they may be identical or different. When at least two groups $R^{106}$ are included, they may be identical or different.

(23)

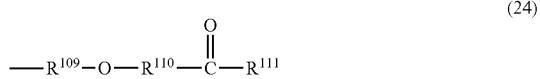

(24)

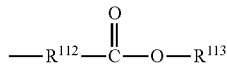

(25)

In formulae (23) to (25), $R^{107}$, $R^{109}$ and $R^{112}$ are each independently a straight or branched $C_1$-$C_4$ alkylene group. $R^{108}$ and $R^{111}$ are each independently hydrogen or a straight, branched or cyclic $C_1$-$C_{20}$ alkyl group which may contain at least one hydroxyl moiety, ether bond, ester bond and/or lactone ring. $R^{110}$ is a single bond or a straight or branched $C_1$-$C_4$ alkylene group. $R^{113}$ is a straight, branched or cyclic $C_1$-$C_{20}$ alkyl group which may contain at least one hydroxyl moiety, ether bond, ester bond and/or lactone ring.

Examples of the compound having formula (22) include, but are not limited to, tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine. tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)

bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis (methoxycarbonylmethyl)amine, N-hexylbis (methoxycarbonylmethyl)amine, and β-(diethylamine)-δvalerolactone. These compounds may be used alone or in admixture of two or more.

The quencher may be formulated in an amount of 0 to 3 parts by weight per 100 parts by weight of component (A). From the standpoint of sensitivity, the amount of the quencher is preferably 0.01 to 1 part by weight.

Other Components

Besides the aforementioned components, the photosensitive resin composition may include optional additives, for example, surfactants and silane coupling agents.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The surfactant is effective for improving coating properties. The amount of surfactant is not particularly limited as long as the benefits of the invention are not impaired. When used, the amount of the surfactant is preferably 0.01 to 1% by weight of the photosensitive resin composition.

Suitable silane coupling agents include epoxy silane coupling agents and aromatic aminosilane coupling agents. The silane coupling agent may be used alone or in admixture. Inclusion of the silane coupling agent is effective for enhancing the adhesion of the resin composition to adherends. The amount of the silane coupling agent used is not particularly limited as long as the benefits of the invention are not impaired. When used, the amount of the silane coupling agent is preferably 0.01 to 5% by weight of the resin composition.

The photosensitive resin composition of the invention is prepared in any desired way. For example, it may be prepared by agitating and mixing the aforementioned components and optionally passing the mixture through a filter to remove any solids.

Pattern Forming Process Using Photosensitive Resin Composition

A further embodiment of the invention is a pattern forming process comprising the steps of:
  (i) coating the photosensitive resin composition onto a substrate to form a photosensitive resin coating thereon,
  (ii) exposing the photosensitive resin coating to radiation through a photomask, and
  (iii) developing the exposed photosensitive resin coating in a developer.

In step (i), the photosensitive resin composition is coated onto a substrate to form a photosensitive resin coating thereon. Examples of the substrate include silicon wafers, glass wafers, quartz wafers, plastic circuit substrates, and ceramic circuit substrates.

The coating technique may be dipping, spin coating, roll coating or the like. The coating weight may be selected as appropriate for a particular purpose, preferably so as to form a resin coating having a thickness of 0.1 to 100 μm.

At this point, the coating may be prebaked to evaporate off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation through a photomask. The exposure radiation is generally of wavelength 240 to 500 nm. Examples of the radiation of wavelength 240 to 500 nm include radiation of various wavelengths from radiation-emitting units, specifically UV radiation such as g-line or i-line and deep UV (248 nm). An appropriate exposure dose is 10 to 5,000 mJ/cm$^2$.

The photomask used herein may be, for example, one perforated with a desired pattern. Although the material of the photomask is not particularly limited, a material capable of shielding radiation in the above wavelength range, typically chromium is preferred.

The next step may be post-exposure bake (PEB) which is effective for enhancing development sensitivity. PEB is preferably performed at 40 to 160° C. for 1 to 15 minutes, more preferably 2 to 10 minutes.

Step (iii) is to develop the resin coating after the exposure or PEB in a developer. The preferred developers are organic solvents, as used in the photosensitive resin composition, for example, isopropyl alcohol (IPA), propylene glycol monomethyl ether (PGME), and propylene glycol monomethyl ether acetate (PGMEA). Development is effected in a conventional manner, for example, by dipping the exposed coating in the developer. The development is followed by washing, rinsing and drying if necessary. In this way, a resin coating having the desired pattern is obtained. Although the pattern forming process has been described, it is sometimes unnecessary to form a pattern. When it is simply desired to form a uniform film, for example, the same process as above may be followed except that in step (ii), the resin coating is exposed to radiation of suitable wavelength directly, i.e., without the photomask.

If necessary, the patterned coating may be post-cured in an oven or hot plate at a temperature of preferably 120 to 300° C. for 10 minutes to 10 hours for increasing the crosslinking density of the resin coating and removing any residual volatile matter.

Photosensitive Dry Film

A further embodiment of the invention is a photosensitive dry film comprising a support film and a photosensitive resin coating of the photosensitive resin composition thereon.

The photosensitive dry film (support film+photosensitive resin coating) is solid, and the photosensitive resin coating contains no solvent. This eliminates the risk that bubbles resulting from volatilization of solvent are left within the resin coating and between the resin coating and the rugged substrate surface. An appropriate thickness range exists for the resin coating when planarity and step coverage on rugged substrate surface and a substrate lamination spacing are taken into account. It is preferred from the standpoints of planarity, step coverage, and substrate lamination spacing that the photosensitive resin coating have a thickness of 5 to 200 μm, more preferably 10 to 100 μm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C.

The photosensitive dry film has the advantage that when tightly attached to a substrate having asperities on its surface e.g., a substrate having grooves and/or holes with an opening width of 10 to 100 μm and a depth of 10 to 120 μm, the photosensitive resin coating is coated so as to conform to the asperities, achieving high planarity. Since the photosensitive resin coating is characterized by low surface tension, higher planarity is achievable. Further, when the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support film is unwound from a supply roll in the film coater, passed across the head of the film coater where the photosensitive resin composition is coated onto the support film to the predetermined buildup, and then moved through a hot air circulating oven at a predetermined temperature for a predetermined time, where the photosensitive resin coating is dried on the support film. Thereafter, the support film having the photosensitive resin coating thereon and a protective film which is unwound from another supply roll in the film coater are passed across a laminate roll under a predetermined pressure whereby the protective film is bonded to the photosensitive resin coating on the support film, whereupon the laminate (protective film-bearing photosensitive dry film) is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8 from Toray Advanced Film Co., Ltd.; E7302 and E7304 from Toyobo Co., Ltd.; Purex® G31 and Purex® G71T1 from Teijin Film Solution Co., Ltd.; and PET38×1-A3, PET38×1-V8 and PET38×1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of mapping or curling on a take-up roll.

Pattern Forming Process Using Photosensitive Dry Film

A further embodiment of the invention is a pattern forming process comprising the steps of:
(i') attaching the photosensitive dry film at its photosensitive resin coating to a substrate to form the photosensitive resin coating thereon,
(ii) exposing the photosensitive resin coating to radiation through a photomask,
(iii) developing the exposed photosensitive resin coating in a developer, and optionally
(iv) post-curing the patterned coating from the development step (iii) at a temperature of 100 to 250° C.

In step (i), the photosensitive dry film at its photosensitive resin coating is attached to a substrate after stripping the protective film, if any, from the dry film. The dry film may be attached using a film attachment apparatus.

Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Also useful are substrates having grooves and/or holes having an opening width of 10 to 100 μm and a depth of 10 to 120 μm.

The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of 10 to 1,000 μm, preferably 100 to 500 μm is obtained.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour. Like the pattern forming process using the photosensitive resin composition, the photosensitive resin coating attached to the substrate may be subjected to steps of (ii) exposing the photosensitive resin coating to radiation through a photomask and optional PEB, (iii) developing the photosensitive resin coating in a developer, optionally boding the resin coating to another substrate, and optionally (iv) post-curing the patterned coating. It is noted that the support film of the photosensitive dry film may be removed before prebake or before PEB, by mechanical stopping or the like, depending on a particular process.

The (cured) resin coating obtained from the photosensitive resin composition or photosensitive dry film has excellent properties including heat resistance, flexibility, electric insulation, mechanical properties, and substrate adhesion and is thus best suited as protective film for electric and electronic parts such as semiconductor devices and as substrate bonding film.

Laminate

A still further embodiment of the invention is a laminate comprising a substrate provided with grooves and/or holes having an opening width of 10 to 100 μm and a depth of 10 to 120 μm and a photosensitive resin coating formed thereon from the photosensitive resin composition or transferred thereon from the photosensitive dry film.

The laminate having a photosensitive resin coating formed thereon from the photosensitive resin composition or photosensitive dry film is improved in adhesion between the substrate and the cured layer resulting from photo-curing of the photosensitive resin coating, and provides high flatness even when the substrate is rugged.

Opto-Semiconductor Device and Optical Device

An opto-semiconductor device may be produced by using the photosensitive resin composition or photosensitive dry film, and processing it to form a fine size pattern according to the aforementioned method. Since a coating of the photosensitive resin composition has excellent transparency, light resistance and heat resistance, an opto-semiconductor device having the coating is advantageously used as optical devices including light-emitting devices such as LED, light-receiving devices such as photodiodes, optical sensors, and CMOS image sensors, and optical transmission devices such as optical waveguides. Preferably the coating has a transmittance of at least 96.0%, more preferably at least 99.0% with respect to light of wavelength 405 nm.

EXAMPLE

Examples of the invention are given below by way of illustration and not by way of limitation. Notably, the weight average molecular weight (Mw) is measured by GPC versus polystyrene standards using THF solvent. All parts are by weight (pbw).

Compounds (S-1), (S-2) and (S-3) used in Examples and Comparative Examples are identified below, which are available from Shin-Etsu Chemical Co., Ltd.

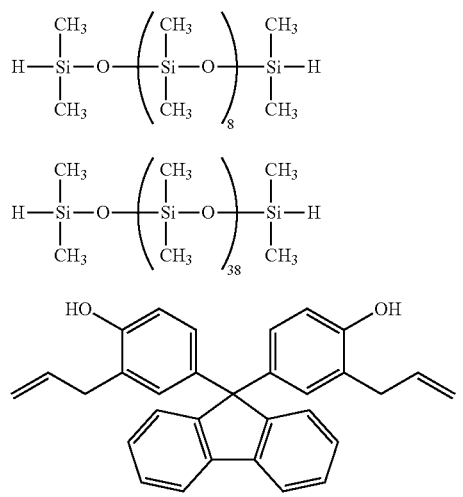

[1] Synthesis of Epoxy-Containing, Isocyanurate-Modified Silicone Resins

Example 1-1

Synthesis of Resin A-1

A flask equipped with a stirrer and thermometer was charged with 55.3 g (0.02 mol) of Compound (S-2), 4.8 g (0.02 mol) of 1,3,5,7-tetramethylcyclotetrasiloxane, 9.7 g (0.05 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 7.4 g (0.06 mol) of 1,2-epoxy-4-vinylcyclohexane and 8.9 g (0.04 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 75 g of Resin A-1. Resin A-1 had a Mw of 10,200. On $^1$H-NMR analysis, the structure of Resin A-1 was found to contain recurring units having formulae (2), (4) and (6).

Example 1-2

Synthesis of Resin A-2

A flask equipped with a stirrer and thermometer was charged with 12.3 g (0.02 mol) of Compound (S-1), 16.9 g (0.07 mol) of 1,3,5,7-tetramethylcyclotetrasiloxane, 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 19.8 g (0.16 mol) of 1,2-epoxy-4-vinylcyclohexane, 11.2 g (0.06 mol) of 1,3-divinyl-1,1,3,3-tetramethylpropanedisiloxane, 5.3 g (0.02 mol) of 1,3-diallyl-5-glycidyl-1,3,5-triazine, and 4.5 g (0.02 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 115 g of Resin A-2. Resin A-2 had a Mw of 9,900. On $^1$H-NMR analysis, the structure of Resin A-2 was found to contain recurring units having formulae (1) to (6).

Example 1-3

Synthesis of Resin A-3

A flask equipped with a stirrer and thermometer was charged with 55.3 g (0.02 mol) of Compound (S-2), 16.9 g (0.07 mol) of 1,3,5,7-tetramethylcyclotetrasiloxane, 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 19.8 g (0.16 mol) of 1,2-epoxy-4-vinylcyclohexane, 3.7 g (0.02 mol) of 1,3-divinyl-1,1,3,3-tetramethylpropanedisiloxane, 15.9 g (0.06 mol) of 1,3-diallyl-5-glycidyl-1,3,5-triazine, and 4.5 g (0.02 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 115 g of Resin A-3. Resin A-3 had a Mw of 9,800. On $^1$H-NMR analysis, the structure of Resin A-3 was found to contain recurring units having formulae (1) to (6).

Example 1-4

Synthesis of Resin A-4

A flask equipped with a stirrer and thermometer was charged with 83.0 g (0.03 mol) of Compound (S-2), 14.5 g (0.06 mol) of 1,3,5,7-tetramethylcyclotetrasiloxane, 500 g of toluene, and 0.5 g of a 2 wt % ethanol solution of chloroplatinic acid. With the flask in an oil bath, the solution was stirred at an internal temperature of 70° C. Thereafter, 17.4 g (0.14 mol) of 1,2-epoxy-4-vinylcyclohexane, 8.0 g (0.03 mol) of 1,3-diallyl-5-glycidyl-1,3,5-triazine and 11.2 g (0.05 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 121 g of Resin A-4. Resin A-4 had a Mw of 9,600. On $^1$H-NMR analysis, the structure of Resin A-4 was found to contain recurring units having formulae (2) and (6).

Example 1-5

Synthesis of Resin A-5

A flask equipped with a stirrer and thermometer was charged with 19.3 g (0.08 mol) of 1,3,5,7-tetramethylcyclotetrasiloxane, 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 22.3 g (0.18 mol) of 1,2-epoxy-4-vinylcyclohexane, 3.7 g (0.02 mol) of 1,3-divinyl-1,1,3,3-tetramethylpropanedisiloxane, and 15.6 g (0.07 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 58 g of Resin A-5. Resin A-5 had a Mw of 9,300. On $^1$H-NMR analysis, the structure of Resin A-5 was found to contain recurring units having formulae (3) to (6).

Example 1-6

Synthesis of Resin A-6

A flask equipped with a stirrer and thermometer was charged with 19.3 g (0.08 mol) of 1,3,5,7-tetramethylcyclotetrasiloxane. 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 22.3 g (0.18 mol) of 1,2-epoxy-4-vinylcyclohexane, 11.2 g (0.06 mol) of 1,3-divinyl-1,1,3,3-tetramethylpropanedisiloxane, and 6.7 g (0.03 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 55 g of Resin A-6. Resin A-6 had a Mw of 9,800. On $^1$H-NMR analysis, the structure of Resin A-6 was found to contain recurring units having formulae (3) to (6).

Example 1-7

Synthesis of Resin A-7

A flask equipped with a stirrer and thermometer was charged with 55.3 g (0.02 mol) of Compound (S-2). 4.8 g (0.02 mol) of 1,3,5,7-tetramethylcyclotetrasiloxane, 5.8 g (0.03 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 4.2 g (0.06 mol) of 1,3-butadiene monoepoxide, 3.7 g (0.02 mol) of 1,3-divinyl-1,1,3,3-tetramethylpropanedisiloxane, and 8.9 g (0.04 mol) of 1,3-diallyl-5-methyl-1,3,5-triazine were added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 115 g of Resin A-7. Resin A-7 had a Mw of 9,700. On $^1$H-NMR analysis, the structure of Resin A-7 was found to contain recurring units having formulae (1) to (6).

Example 1-8

Synthesis of Resin A-8

A flask equipped with a stirrer and thermometer was charged with 27.7 g (0.01 mol) of Compound (S-2), 5.8 g (0.03 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 10.6 g (0.04 mol) of 1,3-diallyl-5-glycidyl-1,3,5-triazine was added dropwise over 20 minutes. Subsequently, 4.8 g (0.02 mol) of 1,3,5,7-tetramethylcyclotetrasiloxane was added dropwise over 20 minutes. Finally, with the internal temperature raised at 90° C., 7.4 g (0.06 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 75 g of Resin A-8. Resin A-8 had a Mw of 9,600. On $^1$H-NMR analysis, the structure of Resin A-8 was found to contain recurring units having formulae (1) to (6).

Example 1-9

Synthesis of Resin A-9

A flask equipped with a stirrer and thermometer was charged with 18.5 g (0.05 mol) of Compound (S-1), 5.8 g (0.03 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 8.0 g (0.03 mol) of 1,3-diallyl-5-glycidyl-1,3,5-triazine was added dropwise over 20 minutes. Subsequently, 4.5 g (0.02 mol) of 1,3-diallyl-5-methyl-1,3,5-triazine was added dropwise over 20 minutes. Further, 4.8 g (0.02 mol) of 1,3,5,7-tetramethlcyclotetrasiloxane was added dropwise over 20 minutes. Finally, with the internal temperature raised at 90° C., 4.2 g (0.06 mol) of 1,3-butadiene monoepoxide was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 75 g of Resin A-9. Resin A-9 had a Mw of 10,300. On $^1$H-NMR analysis, the structure of Resin A-9 was found to contain recurring units having formulae (1) to (6).

Example 1-10

Synthesis of Resin A-10

A flask equipped with a stirrer and thermometer was charged with 49.2 g (0.08 mol) of Compound (S-1), 9.7 g (0.05 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 8.9 g (0.04 mol) of 1,3-diallyl-5-methyl-1,3,5-triazine was added dropwise over 20 minutes. Subsequently, 4.8 g (0.02 mol) of 1,3,5,7-tetramethylcyclotetrasiloxane was added dropwise over 20 minutes. Finally, with the internal temperature raised at 90° C., 7.4 g (0.06 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 80 g of Resin A-10. Resin A-10 had a Mw of 9,700. On $^1$H-NMR analysis, the structure of Resin A-10 was found to contain recurring units having formulae (2), (4) and (6).

Example 1-11

Synthesis of Resin A-11

A flask equipped with a stirrer and thermometer was charged with 12.3 g (0.02 mol) of Compound (S-1) 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 8.0 g (0.03 mol) of 1,3-diallyl-5-glycidyl-1,3,5-triazine, 4.5 g (0.02 mol) of 1,3-diallyl-5-methyl-1,3,5-triazine, and 11.2 g (0.06 mol) of 1,3-divinyl-1,1,3,3-tetramethylpropanedisiloxane were added dropwise over 20 minutes. Subsequently, 16.9 g (0.07 mol) of 1,3,5,7-tetramethylcyclotetrasiloxane was added dropwise over 20 minutes. Finally, with the internal temperature raised at 90° C., 7.4 g (0.06 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C. 1 mmHg) on a rotary evaporator until any distillate was no longer detected, obtaining 76 g of Resin A-11. Resin A-11 had a Mw of 9,900. On $^1$H-NMR analysis, the structure of Resin A-11 was found to contain recurring units having formulae (1) to (6).

Example 1-12

Synthesis of Resin A-12

A flask equipped with a stirrer and thermometer was charged with 55.3 g (0.02 mol) of Compound (S-2), 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 3.7 g (0.02 mol) of 1,3-divinyl-1,1,3,3-tetramethylpropanedisiloxane, 15.9 g (0.06 mol) of 1,3-diallyl-5-glycidyl-1,3,5-triazine, and 4.5 g (0.02 mol) of 1,3-diallyl-5-methyl-1,3,5-triazine were added dropwise over 20 minutes. Subsequently, 12.1 g (0.05 mol) of 1,3,5,7-tetramethylcyclotetrasiloxane was added dropwise over 20 minutes. Finally, with the internal temperature raised at 90° C., 19.8 g (0.16 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 111 g of Resin A-12. Resin A-12 had a Mw pf 9,800. On $^1$H-NMR analysis, the structure of Resin A-12 was found to contain recurring units having formulae (1) to (6).

Example 1-13

Synthesis of Resin A-13

A flask equipped with a stirrer and thermometer was charged with 83.0 g (0.03 mol) of Compound (S-2), 500 g of toluene, and 0.5 g of a 2 wt % ethanol solution of chloroplatinic acid. With the flask in an oil bath, the solution was stirred at an internal temperature of 70° C. Thereafter, 13.3 g (0.05 mol) of 1,3-diallyl-5-glycidyl-1,3,5-triazine and 11.2 g (0.05 mol) of 1,3-diallyl-5-methyl-1,3,5-triazine each were added dropwise over 20 minutes. Subsequently, 12.1 g (0.05 mol) of 1,3,5,7-tetramethylcyclotetrasiloxane was added dropwise over 20 minutes. Finally, with the internal temperature raised at 90° C. 14.9 g (0.12 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 130 g of Resin A-13. Resin A-13 had a Mw of 9,600. On $^1$H-NMR analysis, the structure of Resin A-13 was found to contain recurring units having formulae (2) and (6).

Example 1-14

Synthesis of Resin A-14

A flask equipped with a stirrer and thermometer was charged with 11.2 g (0.06 mol) of 1,3-divinyl-1,1,3,3-tetramethylpropanedisiloxane, 3.9 g (0.02 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 15.6 g (0.07 mol) of 1,3-diallyl-5-methyl-1,3,5-triazine was added dropwise over 20 minutes. Subsequently, 19.3 g (0.08 mol) of 1,3,5,7-tetramethylcyclotetrasiloxane was added dropwise over 20 minutes. Finally, with the internal temperature raised at 90° C., 22.3 g (0.18 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 58 g of Resin A-14. Resin A-14 had a Mw of 9,300. On $^1$H-NMR analysis, the structure of Resin A-14 was found to contain recurring units having formulae (1) to (6).

Example 1-15

Synthesis of Resin A-15

A flask equipped with a stirrer and thermometer was charged with 11.2 g (0.06 mol) of 1,3-divinyl-1,1,3,3-tetramethylpropanedisiloxane, 5.8 g (0.03 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 11.2 g (0.05 mol) of 1,3-diallyl-5-methyl-1,3,5-triazine was added dropwise over 20 minutes. Subsequently 19.3 g (0.08 mol) of 1,3,5,7-tetramethylcyclotetrasiloxane was added dropwise over 20 minutes. Finally, with the internal temperature raised at 90° C., 22.3 g (0.18 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 70 g of Resin A-15. Resin A-15 had a Mw of 9,800. On $^1$H-NMR analysis, the structure of Resin A-15 was found to contain recurring units having formulae (3) to (6).

Example 1-16

Synthesis of Resin A-16

A flask equipped with a stirrer and thermometer was charged with 30.8 g (0.05 mol) of Compound (S-2), 5.8 g (0.03 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 3.7 g (0.02 mol) of 1,3-divinyl-1,1,3,3-tetramethylpropanedisiloxane and 8.9 g (0.04 mol) of 1,3-diallyl-5-methyl-1,3,5-triazine were added dropwise over 20 minutes. Subsequently, 7.2 g (0.03 mol) of 1,3,5,7-tetramethylcyclotetrasiloxane was added dropwise over 20 minutes. Finally, with the internal temperature raised at 90° C., 5.6 g (0.08 mol) of 1,3-butadiene monoepoxide was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 170 g of Resin A-16. Resin A-16 had a Mw of 9,700. On $^1$H-NMR analysis, the structure of Resin A-16 was found to contain recurring units having formulae (1) to (6).

Comparative Example 1-1

Synthesis of Resin CA-1

A flask equipped with a stirrer and thermometer was charged with 7.8 g (0.04 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 22.3 g (0.12 mol) of 1,3-divinyl-1,1,3,3-tetramethyl-propanedisiloxane was added dropwise over 20 minutes. Subsequently, 16.9 g (0.07 mol) of 1,3,5,7-tetramethylcyclotetrasiloxane was added dropwise over 20 minutes. Finally, with the internal temperature raised at 90° C., 19.8 g (0.16 mol) of 1,2-epoxy-4-vinylcyclo-hexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 160 g of Resin CA-1. Resin CA-1 had a Mw of 9,600.

Comparative Example 1-2

Synthesis of Resin CA-2

A flask equipped with a stirrer and thermometer was charged with 49.2 g (0.08 mol) of Compound (S-1), 7.8 g (0.04 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 22.3 g (0.12 mol) of 1,3-divinyl-1,1,3,3-tetramethylpropanedisiloxane was added dropwise over 20 minutes. Subsequently, 16.9 g (0.07 mol) of 1,3,5,7-tetramethylcyclotetrasiloxane was added dropwise over 20 minutes. Finally, with the internal temperature raised at 90° C., 19.8 g (0.16 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 115 g of Resin CA-2. Resin CA-2 had a Mw of 10,000.

Comparative Example 1-3

Synthesis of Resin CA-3

A flask equipped with a stirrer and thermometer was charged with 138.3 g (0.05 mol) of Compound (S-2), 103.2 g (0.24 mol) of Compound (S-3), 7.8 g (0.04 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 27.9 g (0.15 mol) of 1,3-divinyl-1,1,3,3-tetramethyl-propanedisiloxane was added dropwise over 20 minutes. Subsequently, 21.6 g (0.09 mol) of 1,3,5,7-tetramethylcyclotetrasiloxane was added dropwise over 20 minutes. Finally, with the internal temperature raised at 90° C., 14 g (0.2 mol) of 1,3-butadiene monoepoxide was added dropwise over 20 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 310 g of Resin CA-3. Resin CA-3 had a Mw of 12,000.

Comparative Example 1-4

Synthesis of Resin CA-4

A flask equipped with a stirrer and thermometer was charged with 138.3 g (0.05 mol) of Compound (S-2), 51.6 g (0.12 mol) of Compound (S-3), 7.8 g (0.04 mol) of 1,4-bis(dimethylsilyl)benzene, 500 g of toluene, and 0.5 g of a 2 wt % ethanol solution of chloroplatinic acid. With the flask in an oil bath, the solution was stirred at an internal temperature of 70° C. Thereafter, 4.8 g (0.02 mol) of 1,3,5,7-tetramethylcyclotetrasiloxan was added dropwise over 20 minutes. Finally, with the internal temperature raised at 90° C., 7.4 g (0.06 mol) of 1,2-epoxy-4-vinylcyclohexane was added dropwise over 15 minutes. At the end of dropwise addition, the reaction solution was stirred at 90° C. for 3 hours. After the completion of reaction, the reaction solution was heated in vacuum (50° C., 1 mmHg) on a rotary evaporator until any distillate was no longer detected, obtaining 210 g of Resin CA-4. Resin CA-4 had a Mw of 11,000.

[2] Preparation of Photosensitive Resin Compositions

Examples 2-1 to 2-11 and Comparative Examples 2-1 to 2-5

Photosensitive resin compositions 1 to 16 were prepared by combining (A) resin (Resins A-1 to A-9 or CA-1 to CA-4), (B) photoacid generator, (C) crosslinker, (D) solvent, and (E) antioxidant in accordance with the formulation shown in Table 1, agitating them until dissolution, and precision filtering through a Teflon® filter with a pore size of 0.2 µm.

TABLE 1

| | Photosensitive resin composition | Component (A) (pbw) | Component (B) (pbw) | Component (C) (pbw) | Component (D) (pbw) | Component (E) (pbw) |
|---|---|---|---|---|---|---|
| Example 2-1 | 1 | A-1 (100) | B-1 (1) | — | cyclopentanone (50) | — |
| 2-2 | 2 | A-1 (50) | B-1 (1) | C-1 (50) | cyclopentanone (50) | E-1 (0.1) E-2 (0.1) |
| 2-3 | 3 | A-2 (50) | B-1 (1) | C-1 (50) | cyclopentanone (50) | E-1 (0.1) E-2 (0.1) |
| 2-4 | 4 | A-3 (50) | B-1 (1) | C-1 (50) | cyclopentanone (50) | E-1 (0.1) E-2 (0.1) |
| 2-5 | 5 | A-4 (50) | B-1 (1) | C-1 (50) | cyclopentanone (50) | E-1 (0.1) E-2 (0.1) |
| 2-6 | 6 | A-5 (50) | B-1 (1) | C-1 (50) | cyclopentanone (50) | E-1 (0.1) E-2 (0.1) |
| 2-7 | 7 | A-6 (50) | B-1 (1) | C-1 (50) | cyclopentanone (50) | E-1 (0.1) E-2 (0.1) |
| 2-8 | 8 | A-7 (50) | B-1 (1) | C-1 (50) | cyclopentanone (50) | E-1 (0.1) E-2 (0.1) |
| 2-9 | 9 | A-7 (50) | B-1 (1) | C-2 (50) | cyclopentanone (50) | E-1 (0.1) E-2 (0.1) |
| 2-10 | 10 | A-8 (50) | B-1 (1) | C-2 (50) | cyclopentanone (50) | E-1 (0.1) E-2 (0.1) |
| 2-11 | 11 | A-9 (50) | B-1 (1) | C-2 (50) | cyclopentanone (50) | E-1 (0.1) E-2 (0.1) |
| Comparative Example 2-1 | 12 | CA-1 (50) | B-1 (1) | C-1 (50) | cyclopentanone (50) | E-1 (0.1) E-2 (0.1) |
| 2-2 | 13 | CA-1 (59) | B-1 (1) | C-2 (50) | cyclopentanone (50) | E-1 (0.1) E-2 (0.1) |
| 2-3 | 14 | CA-2 (50) | B-1 (1) | C-2 (50) | cyclopentanone (50) | E-1 (0.1) E-2 (0.1) |
| 2-4 | 15 | CA-3 (50) | B-1 (1) | C-2 (50) | cyclopentanone (50) | E-1 (0.1) E-2 (0.1) |
| 2-5 | 16 | CA-4 (50) | B-1 (1) | C-2 (50) | cyclopentanone (50) | E-1 (0.1) E-2 (0.1) |

In Table 1, B-1, C-1, C-2, E-1 and E-2 are identified below.

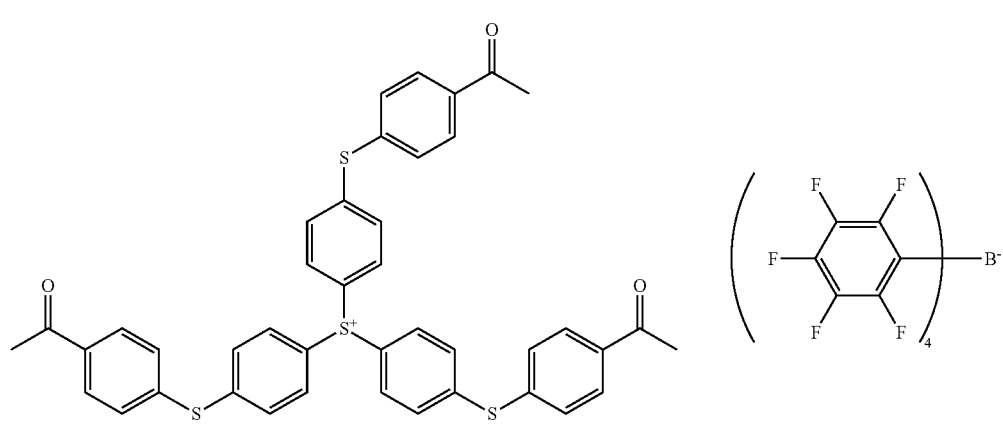

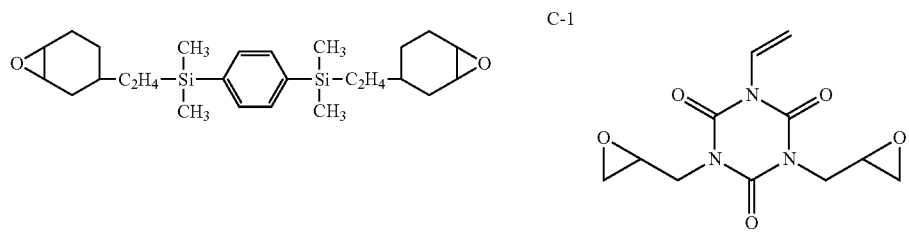

-continued

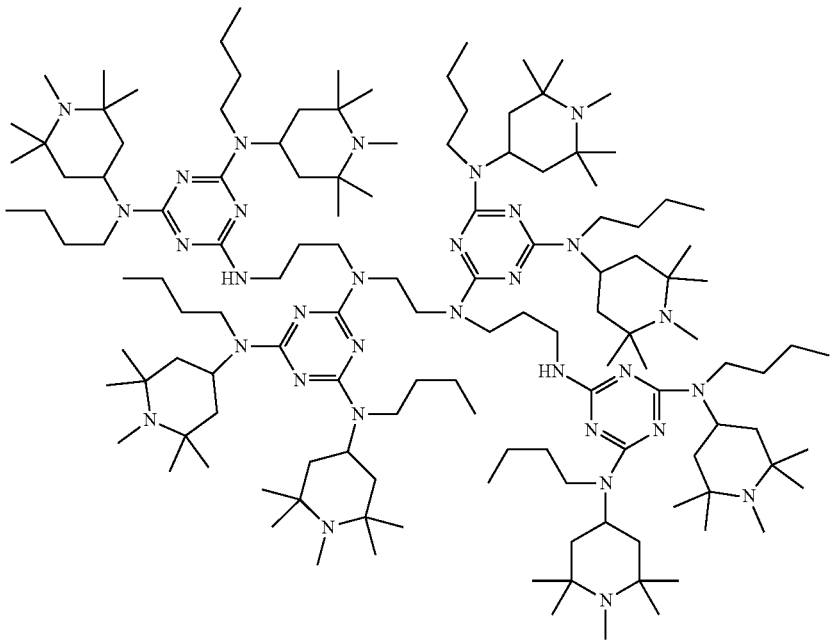

CHIMASSORB 119FL (by BASF)

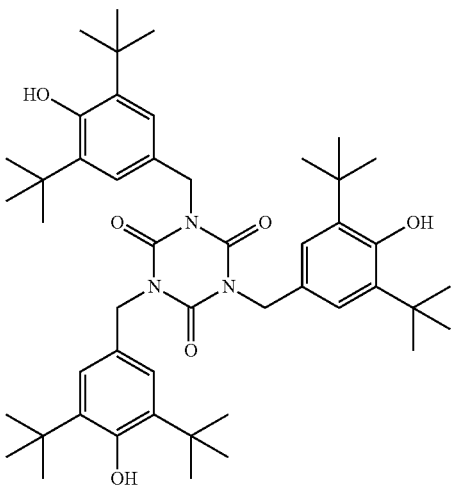

IRGANOX 3114 (by BASF)

Evaluation of Patten Formation

Using a spin coater, each of photosensitive resin compositions 1 to 16 was coated onto a 6-inch silicon wafer, which had been primed with hexamethyldisilazane (HMDS), to form a coating having the thickness shown in Table 2. The coated silicon wafer was placed on a hotplate and heat dried at 100° C. for 2 minutes in order to remove the solvent from the composition.

The composition applied to the silicon wafer was exposed to light of wavelength 365 nm in the exposure dose shown in Table 2, through a quartz mask having groups of lines and spaces of equal width with the line width varying from 1 μm to 50 μm. The exposure was performed using a stepper exposure apparatus NSR-1755i7A (Nikon Corp.). The wafer was post-exposure baked (PEB) at 110° C. for 2 minutes and then cooled.

Subsequently, the coated wafer or substrate was developed by dipping in propylene glycol monomethyl ether acetate (PGMEA) for 3 minutes. The line width resolved during development is reported in Table 2. The coating thickness after development is also reported in Table 2.

TABLE 2

| | | Photosensitive resin composition | Coating thickness after spin coating (μm) | Coating thickness after development (μm) | Exposure dose (mJ/cm²) | Resolution (μm) |
|---|---|---|---|---|---|---|
| Example | 2-1 | 1 | 9.6 | 9.5 | 800 | 15 |
| | 2-2 | 2 | 9.3 | 9.2 | 800 | 10 |
| | 2-3 | 3 | 9.1 | 9.1 | 800 | 10 |

TABLE 2-continued

|  |  | Photosensitive resin composition | Coating thickness after spin coating (μm) | Coating thickness after development (μm) | Exposure dose (mJ/cm²) | Resolution (μm) |
|---|---|---|---|---|---|---|
|  | 2-4 | 4 | 9.4 | 9.3 | 800 | 15 |
|  | 2-5 | 5 | 9.7 | 9.6 | 800 | 15 |
|  | 2-6 | 6 | 9.0 | 9.0 | 800 | 15 |
|  | 2-7 | 7 | 9.5 | 9.5 | 800 | 15 |
|  | 2-8 | 8 | 9.6 | 9.5 | 800 | 15 |
|  | 2-9 | 9 | 9.5 | 9.5 | 800 | 15 |
|  | 2-10 | 10 | 9.5 | 9.7 | 800 | 15 |
|  | 2-11 | 11 | 9.7 | 9.6 | 800 | 15 |
| Comparative Example | 2-1 | 12 | 9.8 | 9.8 | 800 | 20 |
|  | 2-2 | 13 | 9.2 | 9.1 | 800 | 30 |
|  | 2-3 | 14 | 9.5 | 9.3 | 800 | 30 |
|  | 2-4 | 15 | 9.2 | 9.0 | 800 | 25 |
|  | 2-5 | 16 | 9.6 | 9.4 | 800 | 25 |

Light Transmission Test

Using a spin coater, each of photosensitive resin compositions 1 to 16 was coated onto a 6-inch glass wafer, which had been primed with HMDS, to form a coating having the thickness shown in Table 2. The coated glass wafer was placed on a hotplate and heat dried at 100° C. for 2 minutes in order to remove the solvent from the coating.

Using a Mask Aligner MA8 (SUSS MicroTec AG), the coating on the glass wafer was exposed over its entire surface to light of wavelength 360 nm from a high-pressure mercury lamp directly, i.e., not through a mask (flood exposure). The coating was PEB and dipped in PGMEA. The coating which remained after these operations was then heated in an oven at 180° C. for 1 hour, yielding a cured coating. Using a spectrophotometer U-3900H (Hitachi High-Tech Science Corp.), the cured coating was measured for transmittance with respect to light of wavelength 405 nm. The results are shown in Table 3.

TABLE 3

|  | Example |  |  |  |  |  |  |  |  |  |  | Comparative Example |  |  |  |  |
|---|---|---|---|---|---|---|---|---|---|---|---|---|---|---|---|---|
|  | 2-1 | 2-2 | 2-3 | 2-4 | 2-5 | 2-6 | 2-7 | 2-8 | 2-9 | 2-10 | 2-11 | 2-1 | 2-2 | 2-3 | 2-4 | 2-5 |
| Light transmittance (%) @ 405 nm | 99.8 | 99.8 | 99.5 | 99.7 | 99.6 | 99.6 | 99.4 | 99.5 | 99.6 | 99.5 | 99.6 | 98.5 | 97.6 | 97.2 | 98.3 | 97.5 |

Light Transmission Test 2

As in the light transmission test 1, each photosensitive resin composition was coated onto a glass wafer, flood exposed, PEB and developed. Thereafter, another glass wafer was attached to the coated surface on a hotplate at 140° C. The assembly was heated in an oven at 180° C. for 1 hour, obtaining a sample in the form of the cured film sandwiched between glass wafers. In an oven at 120° C., the sample was continuously irradiated with laser radiation of 405 nm and 1 W. Changes of transmittance after 100 hours and 1,000 hours of laser irradiation at wavelength 405 nm were determined, provided that the initial transmittance was 100%. The results are shown in Table 4.

TABLE 4

|  | Laser irradiation time | Example |  |  |  |  |  |  |  |  |  |  | Comparative Example |  |  |  |  |
|---|---|---|---|---|---|---|---|---|---|---|---|---|---|---|---|---|---|
|  |  | 2-1 | 2-2 | 2-3 | 2-4 | 2-5 | 2-6 | 2-7 | 2-8 | 2-9 | 2-10 | 2-11 | 2-1 | 2-2 | 2-3 | 2-4 | 2-5 |
| Change of light transmittance (%) @ 405 nm | 100 hr | 99.8 | 99.8 | 99.5 | 99.7 | 99.6 | 99.6 | 99.3 | 99.5 | 99.6 | 99.7 | 99.7 | 92.5 | 95.8 | 97.2 | 98.3 | 97.5 |
|  | 1,000 hr | 99.8 | 99.7 | 99.3 | 99.6 | 99.6 | 99.3 | 99.1 | 99.2 | 99.5 | 99.6 | 99.5 | 75.2 | 79.3 | 81.2 | 80.3 | 78.1 |

Heat Resistance Test

A silicon wafer sample was prepared by spin coating each of photosensitive resin compositions 1 to 16 onto a silicon wafer, flood exposure, and PEB. The weight of the sample before the test was measured. The sample was held in an oven at 200° C. for 1,000 hours, after which the sample was taken out and measured for weight. A weight change before and after the test was computed as an index of heat resistance. The sample was rated good when the weight change after the test was less than 0.5% by weight and poor when the weight change was equal to or more than 0.5% by weight. The results are shown in Table 5.

TABLE 5

| | Example | | | | | | | | | | | Comparative Example | | | | |
|---|---|---|---|---|---|---|---|---|---|---|---|---|---|---|---|---|
| | 2-1 | 2-2 | 2-3 | 2-4 | 2-5 | 2-6 | 2-7 | 2-8 | 2-9 | 2-10 | 2-11 | 2-1 | 2-2 | 2-3 | 2-4 | 2-5 |
| Heat resistance | Good | Good | Good | Good | Good | Good | Good | Good | Good | Good | Good | Poor | Poor | Poor | Poor | Poor |

As is evident from the results, the photosensitive resin compositions within the scope of the invention form coatings which can be processed into a fine size pattern without any film thickness loss, indicating satisfactory properties as photosensitive material. In addition, the coatings have high light transmission, satisfactory light resistance and heat resistance and are thus useful as a material for optical devices.

[3] Preparation of Photosensitive Resin Composition and Photosensitive Dry Film and Evaluation Thereof Examples 3-1 to 3-12 and Comparative Examples 3-1 to 3-5

Photosensitive resin compositions 17 to 33 were prepared by combining (A) resin (Resins A-8 to A-16 or CA-2 to CA-4), (B) photoacid generator, (C) crosslinker, (D) solvent, (E) antioxidant, and (F) quencher in accordance with the formulation shown in Table 6, agitating them until dissolution, and precision filtering through a Teflon® filter with a pore size of 0.2 μm.

In Table 6, B-1, C-1, C-2, E-1 and E-2 are as identified above, whereas F-1 is identified below.

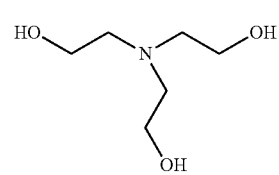

F-1

Preparation of Photosensitive Dry Film

A die coater was used as the film coater and a polyethylene terephthalate (PET) film of 38 μm thick used as the support film. Each of photosensitive resin compositions 17 to 33 was coated onto the support film. The coated film was passed through a hot air circulating oven (length 4 m) set at 100° C. over 5 minutes to form a photosensitive resin coating on the support film, yielding a photosensitive dry film. Using a laminating roll, a polyethylene film of 50 μm thick as the protective film was bonded to the photosensitive

TABLE 6

| | | Photosensitive resin composition | Component (A) (pbw) | Component (B) (pbw) | Component (C) (pbw) | Component (D) (pbw) | Component (E) (pbw) | Component (F) (pbw) |
|---|---|---|---|---|---|---|---|---|
| Example | 3-1 | 17 | A-8 (50) | B-1 (1) | C-1 (50) | cyclopentanone (50) | E-1 (0.1) E-2 (0.1) | — |
| | 3-2 | 18 | A-9 (50) | B-1 (1) | C-2 (50) | cyclopentanone (50) | E-1 (0.1) E-2 (0.1) | — |
| | 3-3 | 19 | A-10 (100) | B-1 (1) | — | cyclopentanone (50) | — | — |
| | 3-4 | 20 | A-10 (50) | B-1 (1) | C-1 (50) | cyclopentanone (50) | E-1 (0.1) E-2 (0.1) | — |
| | 3-5 | 21 | A-11 (50) | B-1 (1) | C-1 (50) | cyclopentanone (50) | E-1 (0.1) E-2 (0.1) | — |
| | 3-6 | 22 | A-12 (50) | B-1 (1) | C-1 (50) | cyclopentanone (50) | E-1 (0.1) E-2 (0.1) | — |
| | 3-7 | 23 | A-13 (50) | B-1 (1) | C-1 (50) | cyclopentanone (50) | E-1 (0.1) E-2 (0.1) | — |
| | 3-8 | 24 | A-14 (50) | B-1 (1) | C-1 (50) | cyclopentanone (50) | E-1 (0.1) E-2 (0.1) | — |
| | 3-9 | 25 | A-15 (50) | B-1 (1) | C-1 (50) | cyclopentanone (50) | E-1 (0.1) E-2 (0.1) | — |
| | 3-10 | 26 | A-16 (50) | B-1 (1) | C-1 (50) | cyclopentanone (50) | E-1 (0.1) E-2 (0.1) | — |
| | 3-11 | 27 | A-16 (50) | B-1 (1) | C-2 (50) | cyclopentanone (50) | E-1 (0.1) E-2 (0.1) | — |
| | 3-12 | 28 | A-8 (50) | B-1 (1) | C-1 (50) | cyclopentanone (50) | E-1 (0.1) E-2 (0.1) | F-1 (0.03) |
| Comparative Example | 3-1 | 29 | CA-2 (50) | B-1 (1) | C-1 (50) | cyclopentanone (50) | E-1 (0.1) E-2 (0.1) | — |
| | 3-2 | 30 | CA-2 (50) | B-1 (1) | C-2 (50) | cyclopentanone (50) | E-1 (0.1) E-2 (0.1) | — |
| | 3-3 | 31 | CA-3 (50) | B-1 (1) | C-1 (50) | cyclopentanone (50) | E-1 (0.1) E-2 (0.1) | — |
| | 3-4 | 32 | CA-4 (50) | B-1 (1) | C-2 (50) | cyclopentanone (50) | E-1 (0.1) E-2 (0.1) | — |
| | 3-5 | 33 | CA-2 (50) | B-1 (1) | C-1 (50) | cyclopentanone (50) | E-1 (0.1) E-2 (0.1) | F-1 (0.03) | resin coating under a pressure of 1 MPa, yielding a protective film-bearing photosensitive dry film. The thickness of each photosensitive resin coating is tabulated in Table 7. The thickness of a resin coating was measured by an optical interference film thickness gauge.

Pattern Formation Test

From the protective film-bearing photosensitive dry film, the protective film was shipped off. Using a vacuum laminator TEAM-100RF (Takatori Corp.) with a vacuum chamber set at a vacuum of 80 Pa, the photosensitive resin coating on the support film was closely bonded to a migration test substrate (comb-shaped electrode-bearing substrate, conductor: copper, conductor spacing and width: 20 μm, conductor thickness: 4 μm). The temperature was 110° C. After restoration of atmospheric pressure, the substrate was taken out of the laminator, and the support film was stripped off. Then the photosensitive resin coating was prebaked on a hot plate at 130° C. for 5 minutes for enhancing adhesion to the substrate.

Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in PGMEA for 300 seconds to form a hole pattern.

The patterned photosensitive resin coating on the substrate was post-cured in an oven at 180° C. for 2 hours while the oven was purged with nitrogen. Under a scanning electron microscope (SEM), the contact hole patterns of 100 μm, 80 μm, 60 μm, 40 μm, and 20 μm were observed in cross section, with the minimum hole pattern in which holes extended down to the film bottom being reported as maximum resolution. From the cross-sectional photo, the contact hole pattern of 80 μm was evaluated for perpendicularity, and rated excellent (◎) for perpendicular pattern, good (○) for slightly inversely tapered profile, fair (Δ) for inversely tapered profile, and poor (X) for opening failure.

Electric Property (Dielectric Breakdown Strength) Test

For the evaluation of dielectric breakdown strength of a cured coating of a photosensitive resin composition, each of photosensitive resin compositions 17 to 33 was coated onto a steel plate of 13 cm×15 cm×0.7 mm (thick) by means of a bar coater and heated in an oven at 180° C. for 2 hours to form a cured coating. The resin composition was coated such that the cured coating had a thickness of 0.2 μm. The cured coating was tested by a breakdown tester TM-5031AM (Tama Densoku Co., Ltd.) to determine the dielectric breakdown strength thereof.

Reliability (Adhesion, Crack Resistance) Test

Each of the photosensitive resin film-bearing substrates after pattern formation and post-cure in the above test was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed whether or not the resin coating peeled from the wafer and whether or not the resin coating cracked.

Heat Resistance Test

Prior to the heat resistance test, the weight of a specimen (prepared in the above reliability evaluation) was measured. The specimen was held in an oven at 200° C. for 1,000 hours, taken out of the oven, and measured for weight again. The sample was rated good when the weight change before and after the test was less than 0.5%, and poor when the weight change was equal to or more than 0.5%.

The results are shown in Table 7.

TABLE 7

| | | Example | | | | | | | | | | Example | | Comparative Example | | | | |
|---|---|---|---|---|---|---|---|---|---|---|---|---|---|---|---|---|---|---|
| | | 3-1 | 3-2 | 3-3 | 3-4 | 3-5 | 3-6 | 3-7 | 3-8 | 3-9 | 3-10 | 3-11 | 3-12 | 3-1 | 3-2 | 3-3 | 3-4 | 3-5 |
| Resin layer thickness (μm) | | 59.2 | 59.6 | 59.6 | 59.3 | 59.1 | 59.4 | 59.7 | 59.0 | 59.5 | 59.6 | 59.5 | 59.3 | 59.8 | 59.2 | 59.3 | 59.5 | 59.6 |
| Hole pattern profile | | ○ | ○ | ○ | ○ | ◎ | ○ | ○ | ○ | ○ | ○ | ○ | ○ | ○ | ○ | ○ | ○ | ○ |
| Maximum resolution (μm) | | 60 | 60 | 80 | 60 | 20 | 40 | 40 | 80 | 60 | 60 | | | | | | | |
| Dielectric breakdown strength (V/μm) | | 530 | 540 | 510 | 550 | 580 | 540 | 530 | 490 | 510 | 500 | | | | | | | |
| Reliability | Peel | nil | nil | nil | nil | nil | nil | nil | nil | nil | nil | | | | | | | |
| | Crack | nil | nil | nil | nil | nil | nil | nil | nil | nil | nil | | | | | | | |
| Heat resistance | | Good | Good | Good | Good | Good | Good | Good | Good | Good | Good | | | | | | | |

TABLE 7-continued

| | | | | | | | |
|---|---|---|---|---|---|---|---|
| Maximum resolution (μm) | | 60 | 60 | 80 | 80 | 60 | 60 | 60 |
| Dielectric breakdown strength (V/μm) | | 525 | 540 | 520 | 575 | 530 | 560 | 545 |
| Reliability | Peel | nil | nil | Peeled | Peeled | nil | nil | nil |
| | Crack | nil | nil | Cracked | Cracked | Cracked | Cracked | Cracked |
| Heat resistance | | Good | Good | Good | Poor | Poor | Poor | Poor |

As is evident from the test results, the photosensitive resin compositions within the scope of the invention exhibit good resolution, i.e., sufficient properties as photosensitive material. The cured coatings obtained therefrom have improved electric properties (e.g., dielectric breakdown strength) and heat resistance, as well as improved adhesion and crack resistance in a thermal cycling test, and are thus useful as protective film for circuits and electronic parts. Thus photosensitive dry films having more reliability are available.

Japanese Patent Application Nos. 2017-166498 and 2018-107880 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An epoxy-containing, isocyanurate-modified silicone resin comprising recurring units having the formulae (1) to (6):

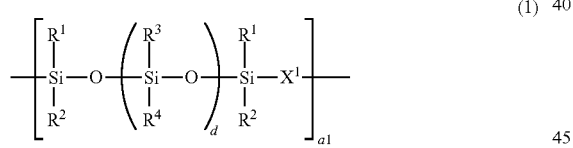
(1)

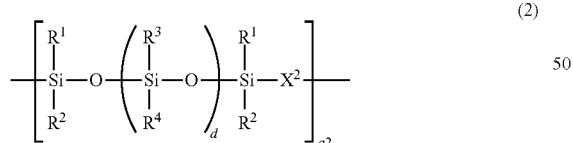
(2)

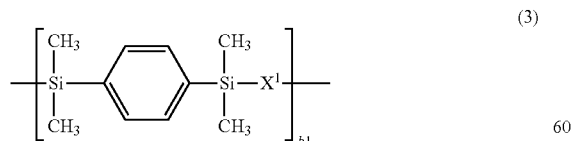
(3)

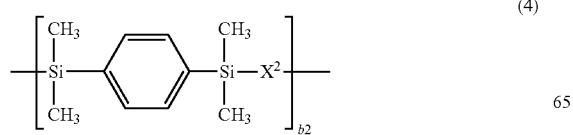
(4)

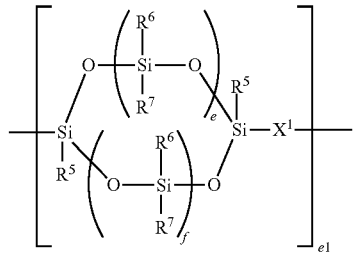
(5)

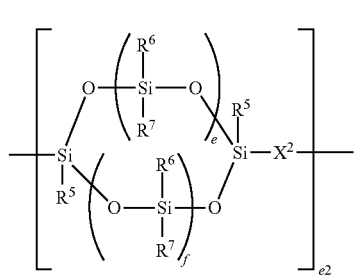
(6)

wherein $R^1$ to $R^7$ are each independently hydrogen or a monovalent organic group, at least one of $R^5$ to $R^7$ being an epoxy-containing organic group, a1, a2, b1, b2, c1 and c2 are numbers in the range: $0 \le a1 < 1$, $0 \le a2 < 1$, $0 \le b1 < 1$, $0 \le b2 < 1$, $0 \le c1 < 1$, $0.2 \le c2 < 1$, $0 < a2+b2 < 1$, $0 < a2+b2+c2 \le 1$, and $a1+a2+b1+b2+c1+c2=1$, d is an integer of 0 to 300, e and f are integers in the range: $0 \le e \le 300$, $0 \le f \le 300$, and $0 \le e+f \le 300$, $X^1$ is a divalent group having the formula (7):

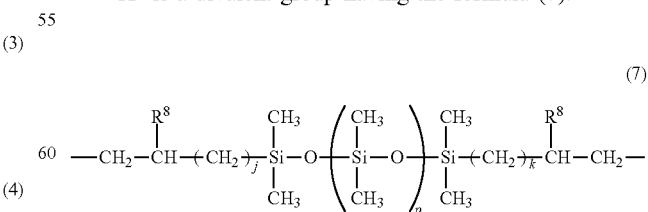
(7)

wherein $R^8$ is each independently hydrogen or methyl, j and k are each independently an integer of 0 to 7, p is an integer of 0 to 300, $X^2$ is a divalent group having the formula (8):

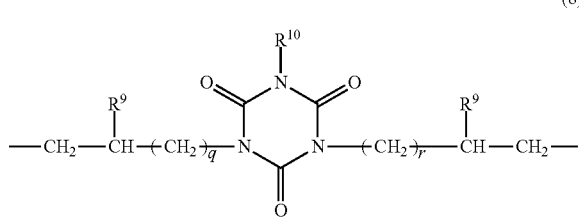

(8)

wherein $R^9$ is each independently hydrogen or methyl, $R^{10}$ is a $C_1$-$C_8$ alkyl, allyl, glycidyl or $C_6$-$C_{10}$ aryl group, q and r are each independently an integer of 0 to 7.

2. The epoxy-containing, isocyanurate-modified silicone resin of claim 1 wherein $R^1$ to $R^7$ are each independently hydrogen, a $C_1$-$C_8$ monovalent hydrocarbon group, or an epoxy-containing organic group having the formula (9) or (10), at least one of $R^5$ to $R^7$ being an epoxy-containing organic group having the formula (9) or (10),

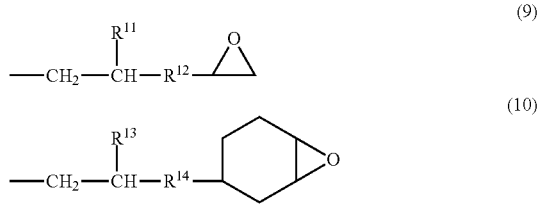

(9)

(10)

wherein $R^{11}$ and $R^{13}$ are each independently hydrogen or methyl, $R^{12}$ and $R^{14}$ are each independently a single bond or $C_1$-$C_8$ alkylene group in which any methylene moiety may be substituted by an ether bond, sulfide bond or phenylene moiety.

3. A photosensitive resin composition comprising (A) the epoxy-containing, isocyanurate-modified silicone resin of claim 1 and (B) a photoacid generator which is decomposed to generate an acid upon light exposure.

4. The photosensitive resin composition of claim 3, further comprising (C) a crosslinker containing an epoxy-containing compound.

5. The photosensitive resin composition of claim 4 wherein the epoxy-containing compound is a compound having on the average at least two epoxy groups in the molecule.

6. The photosensitive resin composition of claim 3, further comprising (D) a solvent.

7. The photosensitive resin composition of claim 3, further comprising (E) an antioxidant.

8. The photosensitive resin composition of claim 3, further comprising (F) a quencher.

9. A photosensitive resin coating formed of the photosensitive resin composition of claim 3.

10. A pattern forming process comprising the steps of:
(i) coating the photosensitive resin composition of claim 3 onto a substrate to form a photosensitive resin coating thereon,
(ii) exposing the photosensitive resin coating to radiation through a photomask, and
(iii) developing the exposed resin coating in a developer.

11. The pattern forming process of claim 10, further comprising the step of baking the resin coating after exposure and before development.

12. The pattern forming process of claim 10, further comprising the step of post-curing the resin coating at a temperature of 120 to 300° C. after development.

13. The pattern forming process of claim 10 wherein the substrate has grooves and/or holes having an opening width of 10 to 100 μm and a depth of 10 to 120 μm.

14. A method for producing an opto-semiconductor device, comprising the pattern forming process of claim 10, the opto-semiconductor device having a pattern of the photosensitive resin coating.

15. A method for producing an optical device, comprising the pattern forming process of claim 10, the optical device having a pattern of the photosensitive resin coating.

16. A photosensitive resin coating comprising (A) the epoxy-containing, isocyanurate-modified silicone resin of claim 1 and (B) a photoacid generator which is decomposed to generate an acid upon light exposure.

17. A photosensitive dry film comprising a support film and the photosensitive resin coating of claim 16 thereon.

18. A pattern forming process comprising the steps of:
(i') attaching the photosensitive dry film of claim 17 at its photosensitive resin coating to a substrate to dispose the photosensitive resin coating thereon,
(ii) exposing the photosensitive resin coating to radiation through a photomask, and
(iii) developing the exposed resin coating in a developer.

19. A laminate comprising a substrate having grooves and/or holes having an opening width of 10 to 100 μm and a depth of 10 to 120 μm and the photosensitive resin coating of claim 16 thereon.

20. The epoxy-containing, isocyanurate-modified silicone resin of claim 1 wherein a1, a2, b1, b2, c1 and c2 are numbers in the range: $0 \leq a1 \leq 0.6$, $0 \leq a2 \leq 0.8$, $0 \leq b1 \leq 0.6$, $0 \leq b2 \leq 0.8$, $0 \leq c1 \leq 0.6$, $0.2 \leq c2 \leq 0.8$, $0.2 \leq a2+b2 \leq 0.8$, $0.4 \leq a2+b2+c2 \leq 1$, and $a1+a2+b1+b2+c1+c2=1$.

21. The epoxy-containing, isocyanurate-modified silicone resin of claim 1 wherein a1, a2, b1, b2, c1 and c2 are numbers in the range: $0 \leq a1 < 1$, $0 \leq a2 < 1$, $0 \leq b1 < 1$, $0 \leq b2 < 1$, $0 \leq c1 < 1$, $0.2 \leq c2 < 1$, $0 < a2+b2 < 1$, $0 < a2+b2+c2 < 1$, and $a1+a2+b1+b2+c1+c2=1$.

22. The epoxy-containing, isocyanurate-modified silicone resin of claim 1 wherein $0 < c1 < 1$.

* * * * *